United States Patent [19]
Yoshikawa et al.

[11] Patent Number: 6,150,754
[45] Date of Patent: Nov. 21, 2000

[54] ELECTROMAGNETIC-WAVE SHIELDING AND LIGHT TRANSMITTING PLATE AND DISPLAY PANEL

[75] Inventors: Masato Yoshikawa; Yasuhiro Morimura, both of Tokyo, Japan

[73] Assignee: Bridgestone Corporation, Tokyo, Japan

[21] Appl. No.: 09/207,151

[22] Filed: Dec. 8, 1998

[30] Foreign Application Priority Data

Dec. 22, 1997 [JP] Japan .................................... 9-353204
Dec. 22, 1997 [JP] Japan .................................... 9-353205
Dec. 22, 1997 [JP] Japan .................................... 9-353206
Dec. 22, 1997 [JP] Japan .................................... 9-353207

[51] Int. Cl.$^7$ ...................................................... H01J 5/16
[52] U.S. Cl. ........................................... 313/313; 313/479
[58] Field of Search .................................... 313/479, 473, 313/112, 313, 582

[56] References Cited

U.S. PATENT DOCUMENTS 4,412,255 10/1983 Kuhlman et al. .
5,851,647 12/1998 Foster .................................. 428/304.4

FOREIGN PATENT DOCUMENTS 9-147752 6/1997 Japan .

OTHER PUBLICATIONS

Patent Abstracts of Japan, vo,. 1997, No. 10, Oct. 31, 1997 & JP 09 147752 A (Fujitsu General Ltd), Jun. 11, 1991.
Patent Abstracts of Japan, vol. 015, No. 228 (M–1123), Jun. 11, 1991 & JP03 069349 A (Tsutsunaka Plast Ind Co Ltd), Mar. 25, 1991.
Patent Abstracts of Japan, vol. 1995, No. 10, Nov. 30, 1995 & JP07176887 A (Tokimec Inc; others:01), Jul. 14, 1995.

Primary Examiner—Vip Patel
Attorney, Agent, or Firm—Kanesaka & Takeuchi

[57] ABSTRACT

An electromagnetic-wave shielding and light transmitting plate or a display panel is provided which comprises a transparent base plate or a PDP body, a transparent base plate, a conductive composite mesh member which is interposed therebetween and bonded together by adhesive intermediate films. Alternatively, an electromagnetic-wave shielding and light transmitting plate or a display panel is provided which comprises a transparent base plate or a PDP body having a transparent conductive film, a transparent base plate, and a conductive composite mesh member which is interposed therebetween and bonded together, wherein a conductive adhesive tape is bonded to cover a range from the outside edges of the transparent conductive film to the outside edges of the transparent base plate through the end faces of the latter, and margins of the conductive composite mesh member are folded and fixed to the transparent base plate or the PDP body by conductive adhesive tapes. The conductive composite mesh member is made by weaving metallic fibers and/or metal-coated organic fibers, of which wire diameter is 200 $\mu$m or less, with transparent fibers together to have an open area ratio 75% or more.

14 Claims, 6 Drawing Sheets

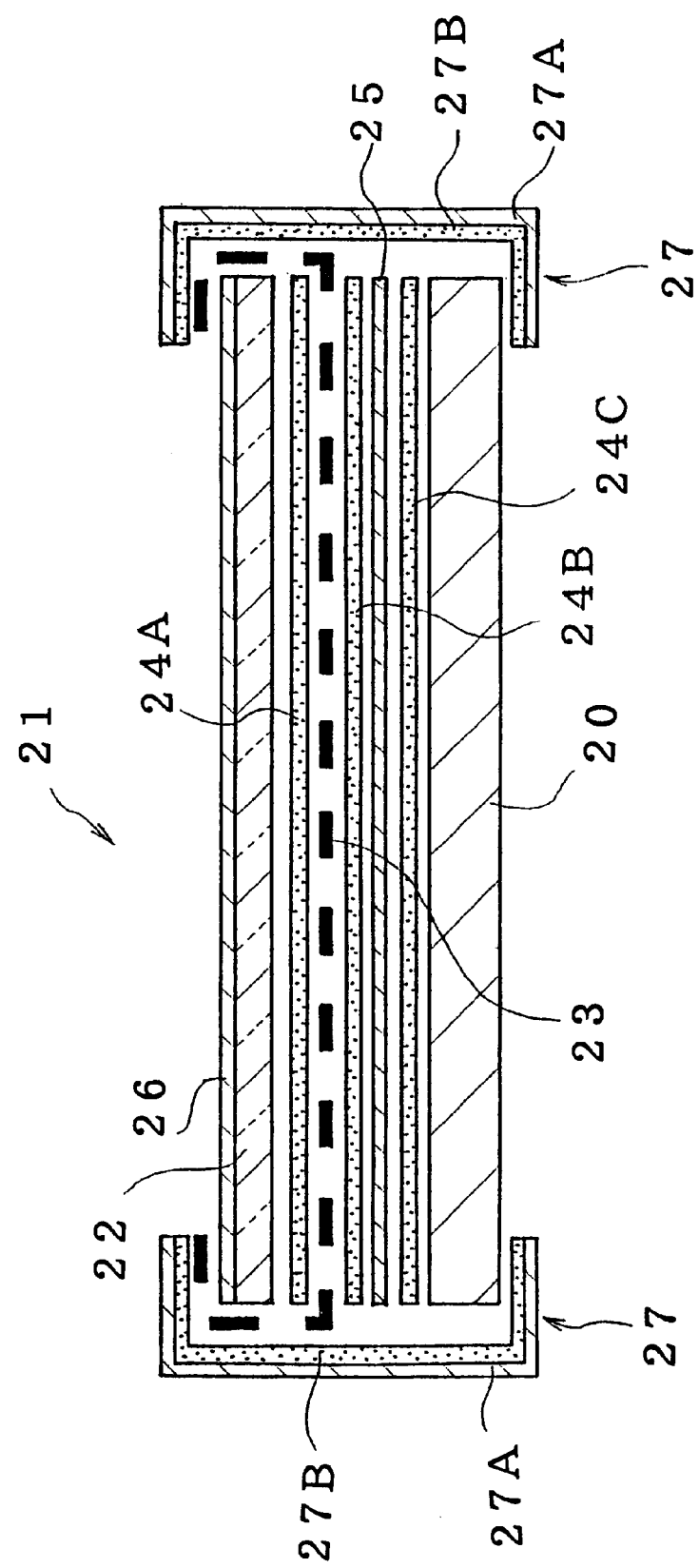

ELECTROMAGNETIC-WAVE SHIELDING AND LIGHT TRANSMITTING PLATE AND DISPLAY PANEL

FIELD OF THE INVENTION

The present invention relates to an electromagnetic-wave shielding and light transmitting plate suitable for a front filter of a PDP (plasma display panel), which has good electromagnetic-wave shielding and light transparency. The present invention also relates to an electromagnetic-wave shielding and light transmitting plate, which can be easily built in a body of equipment such as an office automation apparatus and can provide good current conduction relative to the body of the equipment, and a gas discharge type display panel utilizing a PDP which is integrated with electromagnetic-wave shielding and light transmitting plate to impart electromagnetic-wave shielding efficiency to the display panel itself, thereby lightening its weight, making it thinner, reducing the number of parts, and thus improving the productivity and reducing the cost.

BACKGROUND OF THE INVENTION

With the spread of electronic appliances including office automation apparatuses and communication instruments, electromagnetic wave emission from these appliances have come into a problem. That is, adverse effect of electromagnetic wave to the human body is feared and it is also a problem that the electromagnetic wave affects precision apparatus to cause malfunction.

Therefore, plates having good electromagnetic-wave shielding efficiency and light transparency have developed as front filters for PDPs of the office automation apparatuses and come into commercial use. Such plates are also used as windows of a place where a precision apparatus is installed, such as a hospital or a laboratory in order to protect the precision apparatus from electromagnetic waves form a portable telephone.

A conventional electromagnetic-wave shielding and light transmitting plate typically comprises transparent base plates such as acrylic boards and a conductive mesh member like a wire netting and is formed by interposing the conductive mesh member between the transparent base plates and by assembling them.

A conductive mesh member conventionally used for an electromagnetic-wave shielding and light transmitting plate generally has a wire diameter between 10 $\mu$m and 500 $\mu$m, a sieve opening from about 5 meshes to about 500 meshes, and an open area ratio less than 75%.

In order to provide good electromagnetic-wave shielding efficiency when such an electromagnetic-wave shielding and light transmitting plate is assembled in a body of equipment such as PDP, it is necessary to provide uniform current conduction between the electromagnetic-wave shielding and light transmitting plate and the body of equipment, that is, between the conductive mesh of the electromagnetic-wave shielding and light transmitting plate and a conduction surface of the body.

A structure, which can provide good current conduction between an electromagnetic-wave shielding and light transmitting plate and a body of equipment but is simple, has conventionally proposed (JPA 9-147752). This structure is made by forming a conductive mesh member in such a size that the periphery thereof is positioned outside of peripheral edges of transparent base plates so as to form margins when it is interposed therebetween, then folding the margins on the surface of one of the transparent base plates so that the margins function as conductive portions between the electromagnetic-wave shielding and light transmitting plate and the body of equipment, and bonding the margins to the body of equipment by pressure bonding.

As for the conductive mesh member conventionally used, the larger the wire diameter, the larger is the sieve opening, or, the smaller the wire diameter, the smaller is the sieve opening. This is because a mesh having larger sieve opening can be made by using fibers of larger wire diameter, but it is quite difficult to make a mesh having larger sieve opening by using fibers of smaller wire diameter.

Accordingly, conventional electromagnetic-wave shielding and light transmitting plates employing such conductive mesh member are at a disadvantage in that the light transparency obtained by even the best one is around 70%, that is, good light transparency can not be obtained.

The conventional electromagnetic-wave shielding transmitting plates are also at a disadvantage in that moiré phenomenon (interference fringes) easily occurs because of the relation between the conductive mesh and pitch of pixels of a light emitting panel on which the electromagnetic-wave shielding and light transmitting plate is mounted.

Though both light transparency and electromagnetic-wave shielding efficiency can be provided by combination of such a conductive mesh member and a transparent conductive film, the transparent conductive film is at a disadvantage in that it is not easy to provide conduction relative to a body of equipment.

The conductive mesh member can provide conduction relative to the body of the equipment by means of forming the conductive mesh member such that its periphery is positioned outside of peripheral edges of a transparent base plate and folding the peripheral portions of the conductive mesh member along the peripheral edges of transparent base plate. That is, the conduction between the conductive mesh member and the body of the equipment can be obtained through the folded peripheral portions of the conductive mesh member. In case of the transparent conductive film, however, if the latter is formed so that its periphery is positioned outside of peripheral edges of the transparent base plate and then folded along the peripheral edges of the transparent base plate, the film may tear at the folded portions so that the conduction between the film and the transparent base plate can not be obtained.

Instead of the transparent conductive film, a transparent conductive layer may be directly formed on a bonding surface of one of transparent base plates. In this case, however, the transparent conductive layer is covered by the other transparent base plate, so the conduction from the transparent conductive layer to the body of equipment can not be obtained.

In case of employing a transparent conductive film, any design change, such as forming a through hole in a transparent base plate to provide conduction relative to the transparent conductive film, is necessary, thereby making complex the assembly of an electromagnetic-wave shielding and light transmitting plate and the operation for building in the body of the equipment.

On the other hand, a PDP utilizing a discharging phenomenon has the following advantages in comparison to a liquid crystal display (LCD) and a cathode ray tube (CRT). Therefore, recently it has been researched and developed for practical use, for example, televisions, office automatic apparatus such as personal computers and word processors, traffic apparatus, boards, and other kinds of display panels.

1. It utilizes discharge light so that it is spontaneous light.
2. As its discharge gap is 0.1–0.3 mm, it can be shaped in panel.
3. By using fluorescent substances, it can emit colors.
4. It eases to make wide screen.

The basic display mechanism of the PDP is displaying of letters and figures by selective discharge emitting of fluorescent substances in many discharge cells which are disposed distantly each other between two plate glasses, and for example, has a mechanism as shown in FIG. 6.

In FIG. 6, a numeral 61 designates a front glass, 62 designates a rear glass, 63 designates a bulkhead, 64 designates a display cell (discharge cell), 65 designates an auxiliary cell, 66 designates a cathode, 67 designates a display anode, 68 designates an auxiliary anode. A red fluorescent substance, a green fluorescent substance, or a blue fluorescent substance (not shown) is provided in a film form on internal walls of each display cell 64 and these fluorescent substances emit light by electrical discharges when a voltage is applied between electrodes.

From the front surface of the PDP, electromagnetic waves with frequency from several kHz to several GHz are generated due to applying voltage, electrical discharge, and light emission, and the electromagnetic waves have to be shielded. Moreover, for improving its display contrast, reflection of external light at the front surface has to be prevented.

In order to shield such electromagnetic waves from PDP, a transparent plate which has electromagnetic-wave shielding efficiency is disposed in front of the PDP.

In this case, conductive mesh member conventionally used for an electromagnetic-wave shielding and light transmitting plate generally has a wire diameter between 10 $\mu$m and 500 $\mu$m, a sieve opening from about 5 meshes to about 500 meshes, and an open area ratio less than 75%. As for the conductive mesh member conventionally used, the larger the wire diameter, the larger is the sieve opening, or, the smaller the wire diameter, the smaller is the sieve opening. This is because a mesh having larger sieve opening can be made up of fibers of larger wire diameter, but it is quite difficult to make a mesh having larger sieve opening with fibers of smaller wire diameter.

The PDP which the separate transparent plate is disposed in front of the PDP has defects as follows:

1. Structure for disposing two panels is complicated.
2. As a transparent base plate made of glass or the like is required for each of the PDP and the electromagnetic-wave shielding transparent plate, the PDP and the electromagnetic-wave shielding transparent plate make thicker and heavier in total.
3. The number of parts and man-hours are increased, thereby raising the cost.

Conventional electromagnetic-wave shielding and light transmitting plates employing the conductive mesh member which used, the larger the wire diameter, the larger is the sieve opening, or, the smaller the wire diameter, the smaller is the sieve opening, are at a disadvantage in that the light transparency obtained by even the best one is around 70%, that is, good light transparency can not be obtained.

The conventional electromagnetic-wave shielding transmitting plates are also at a disadvantage in that moiré phenomenon (interference fringes) easily occurs because of the relation between the conductive mesh and pitch of pixels of a light emitting panel.

As mentioned above, a conventional electromagnetic-wave shielding and light transmitting plate typically comprises transparent base plates such as acrylic boards and a conductive mesh member like a wire netting and is formed by interposing the conductive mesh member between the transparent base plates and by assembling them.

In order to provide good electromagnetic-wave shielding efficiency when such an electromagnetic-wave shielding and light transmitting plate is assembled in a body of equipment such as PDP, it is necessary to provide uniform current conduction between the electromagnetic-wave shielding and light transmitting plate and the body of equipment, that is, between the conductive mesh of the electromagnetic-wave shielding and light transmitting plate and a conduction surface of the body.

OBJECT AND SUMMARY OF THE INVENTION

It is the first object of the present invention to provide an electromagnetic-wave shielding and light transmitting plate, suitable for use as an electromagnetic-wave shielding filter for a PDP, which has high electromagnetic-wave shielding efficiency and excellent light transparency and thus can provide distinct pictures.

It is the second object of the present invention to provide an electromagnetic-wave shielding and light transmitting plate, which prevents moiré phenomenon and which is excellent all in its light transparency, its electromagnetic-wave shielding efficiency, and its heat ray (near infrared ray) resistance, comprising a transparent conductive film and a conductive mesh member which are interposed between two transparent base plates, which can be easily assembled, easily built in a body of equipment, and can provide uniform and low-resistant conduction relative to the body of the equipment.

It is the third object of the present invention to provide a display panel utilizing a PDP which is integrated with electromagnetic-wave shielding material to impart electromagnetic-wave shielding efficiency to the display panel itself, thereby lightening its weight, making its wall thinner, reducing the number of parts, and thus improving the productivity and reducing the cost, and to provide a display panel which has good light transparency and high electromagnetic-wave shielding efficiency and thus can provide distinct pictures by preventing moiré phenomenon.

It is another object of the present invention to provide a display panel which can be easily built in the body of the equipment and can provide uniform and low-resistant conduction between the electromagnetic-wave shielding material thereof and the body of the equipment.

An electromagnetic-wave shielding and light transmitting plate of the first aspect of the present invention comprises two transparent base plates and a conductive mesh member wherein the conductive mesh member is interposed between the transparent base plates and integrally bonded together by transparent adhesives. The electromagnetic-wave shielding and light transmitting plate is characterized in that the conductive mesh member is a conductive composite mesh member which is made by weaving metallic fibers and/or metal-coated organic fibers, of which wire diameter is 200 $\mu$m or less, with transparent fibers to have an open area ratio 75% or more.

In the first aspect, because of using the conductive composite mesh member, in which metallic fibers and/or metal-coated organic fibers having wire diameter equal to or less than 200 $\mu$m and transparent fibers are woven together, the mesh configuration can be maintained by the interworking of the transparent fibers even with the larger sieve opening of lattices formed by the metallic fibers and/or metal-coated organic fibers. Therefore, the spaces formed by the metallic fibers and/or metal-coated organic fibers can be larger to obtain excellent light transparency and thus prevent the moiré phenomenon.

Also in the first aspect, the deviation in mesh can be prevented by interposing the conductive composite mesh member between the transparent base plates and integrally bonding them with the transparent adhesives.

An electromagnetic-wave shielding and light transmitting plate of the second aspect comprises a first transparent base plate, a second transparent base plate having a transparent conductive film on one surface thereof, and a conductive mesh member wherein the conductive mesh member is interposed between the transparent base plates and integrally bonded together by transparent adhesives in such a manner that the transparent conductive film is positioned at the bonding side. In the electromagnetic-wave shielding and light transmitting plate, the conductive mesh member is a conductive composite mesh member which is made by weaving metallic fibers and/or metal-coated organic fibers, of which wire diameter is 200 µm or less, with transparent fibers together to have an open area ratio 75% or more, a conductive adhesive tapes (first conductive adhesive tapes) are bonded to cover a range from the outside edges of the transparent conductive film to the outside edges of the other surface of the second transparent base plate through the end faces of the second transparent base, and margins of the conductive mesh member are positioned outside of the peripheral edges of the first and second transparent base plates, folded along the peripheral edges of the second transparent base plate, and attached to the surface of the second transparent base plate.

Since the conductive composite mesh member and the transparent conductive film are interposed between the two transparent base plate, the electromagnetic-wave shielding and light transmitting plate of the second aspect can prevent the moiré phenomenon so as to obtain excellent light transparency, electromagnetic-wave shielding efficiency, and heat-ray (near infrared ray) blocking efficiency. That is, because of using the conductive composite mesh member, in which metallic fibers and/or metal-coated organic fibers having wire diameter equal to or less than 200 µm and transparent fibers are woven together, the mesh configuration can be maintained by the interworking of the transparent fibers even with the larger sieve opening of lattices formed by the metallic fibers and/or metal-coated organic fibers. Therefore, the spaces formed by the metallic fibers and/or metal-coated organic fibers can be larger to obtain excellent light transparency and thus prevent the moiré phenomenon. Since the conductive composite mesh member can be formed in a design having high light transmitting efficiency without moiré phenomenon but having insufficient electromagnetic-wave shielding efficiency, which is however compensated by the transparent conductive film, the electromagnetic-wave shielding and light transmitting plate can be provided with high electromagnetic-wave shielding efficiency and heat-ray (near infrared ray) blocking efficiency.

Also in the second aspect, the deviation in mesh can be prevented by interposing the conductive composite mesh member between the transparent base plates and integrally bonding them with the transparent adhesives.

A display panel of the third aspect of the present invention comprises a plasma display panel body, a conductive mesh member bonded to a front surface of the plasma display panel body by transparent adhesives, and a transparent base plate bonded to a front surface of the conductive mesh member by transparent adhesives. The display panel is characterized in that the conductive mesh member is a conductive composite mesh member which is made by weaving metallic fibers and/or metal-coated organic fibers, of which wire diameter is 200 µm or less, with transparent fibers together to have an open area ratio 75% or more.

In the display panel of the third aspect, the conductive composite mesh member is interposed between the PDP and the transparent base plate and integrated by the transparent adhesives, thereby lightening its weight, making it thinner, reducing the number of parts, and thus improving the productivity and reducing the cost.

In addition, because of using the conductive composite mesh member, in which metallic fibers and/or metal-coated organic fibers having wire diameter equal to or less than 200 µm and transparent fibers are woven together, the mesh configuration can be maintained by the interworking of the transparent fibers even with the larger sieve opening of lattices formed by the metallic fibers and/or metal-coated organic fibers.

Therefore, the spaces formed by the metallic fibers and/or metal-coated organic fibers can be larger to obtain excellent light transparency and thus prevent the moiré phenomenon.

Also in the third aspect, the deviation in mesh can be prevented by interposing the conductive composite mesh member between the transparent base plate and the PDP body and integrally bonding them with the transparent adhesives.

A display panel of the fourth aspect comprises a plasma display panel body, a conductive mesh member bonded to a front surface of the plasma display panel body by transparent adhesives, and a transparent base plate bonded to a front surface of the conductive mesh member by transparent adhesives. In the display panel, the conductive mesh member is a conductive composite mesh member which is made by weaving metallic fibers and/or metal-coated organic fibers, of which wire diameter is 200 µm or less, with transparent fibers together to have an open area ratio 75% or more, a transparent conductive film is further provided between the plasma display panel body and the conductive composite mesh member, conductive adhesive tapes are bonded to cover ranges from the outside edges of the transparent conductive film to the outside edges of the other surface of the plasma display panel body through the end faces of the plasma display panel body, respectively, and margins of the conductive composite mesh member are positioned outside of the peripheral edges of the transparent base plate and the plasma display panel body, folded along the peripheral edges of the plasma display panel body, and attached to the surface of the plasma display panel body.

In the display panel of the fourth aspect, the conductive composite mesh member and the transparent conductive film are interposed between the PDP and the transparent base plate and are integrated by the transparent adhesives, thereby lightening its weight, making it thinner, reducing the number of parts, and thus improving the productivity and reducing the cost.

In display panel of the fourth aspect, the conductive composite mesh member and the transparent conductive film are used as the electromagnetic-wave shielding material, thereby preventing the moiré phenomenon, obtaining excellent light transparency, electromagnetic-wave shielding efficiency, and heat-ray (near infrared ray) blocking efficiency. That is, because of using the conductive composite mesh member, in which metallic fibers and/or metal-coated organic fibers having wire diameter equal to or less than 200 μm and transparent fibers are woven together, the mesh configuration can be maintained by the interworking of the transparent fibers even with the larger sieve opening of lattices formed by the metallic fibers and/or metal-coated organic fibers. Therefore, the spaces formed by the metallic fibers and/or metal-coated organic fibers can be larger to obtain excellent light transparency and thus prevent the moiré phenomenon. Since the conductive composite mesh member can be formed in a design having high light transmitting efficiency without moiré phenomenon but having insufficient electromagnetic-wave shielding efficiency, which can be however compensated by the transparent conductive film, the electromagnetic-wave shielding and light transmitting plate can be provided with high electromagnetic-wave shielding efficiency and heat-ray (near infrared ray) blocking efficiency.

Also in the fourth aspect, the deviation in mesh can be prevented by interposing the conductive composite mesh member between the transparent base plates and bonding them with the transparent adhesives.

When the refraction factor of the transparent fibers of the conductive composite mesh member is largely different from the refraction factor of the transparent adhesives occurs between the transparent fibers and the transparent adhesives, thus resulting irregularity of images. Accordingly, it is preferable that the difference between the refraction factor of the transparent fibers and the refraction factor of the transparent adhesives is ±0.15 or less, particularly ±0.05 or less.

In the present invention, it is preferable that the resin of the transparent adhesives is heat-cross-linkable adhesive resin which contains ethylene-vinyl acetate copolymer as the main component and crosslinking agent.

In the electromagnetic-wave shielding and light transmitting plate or the display panel of the present invention, the safety is improved because the conductive composite mesh member is interposed between the PDP body and the transparent base plate or between the transparent base plates and bonded to be integrated by the transparent adhesives so as to prevent scattering of fragments when damaged.

BRIEF DESCRIPTION OF THE DRAWING

FIG. 4 is a schematic sectional view showing an embodiment of a display panel of the third aspect of the present invention;

DETAILED DESCRIPTION OF PREFERRED EMBODIMENTS

Hereinafter, embodiments of electromagnetic-wave shielding and light transmitting plates of the present invention will be described with reference to the drawings.

Figure 1:
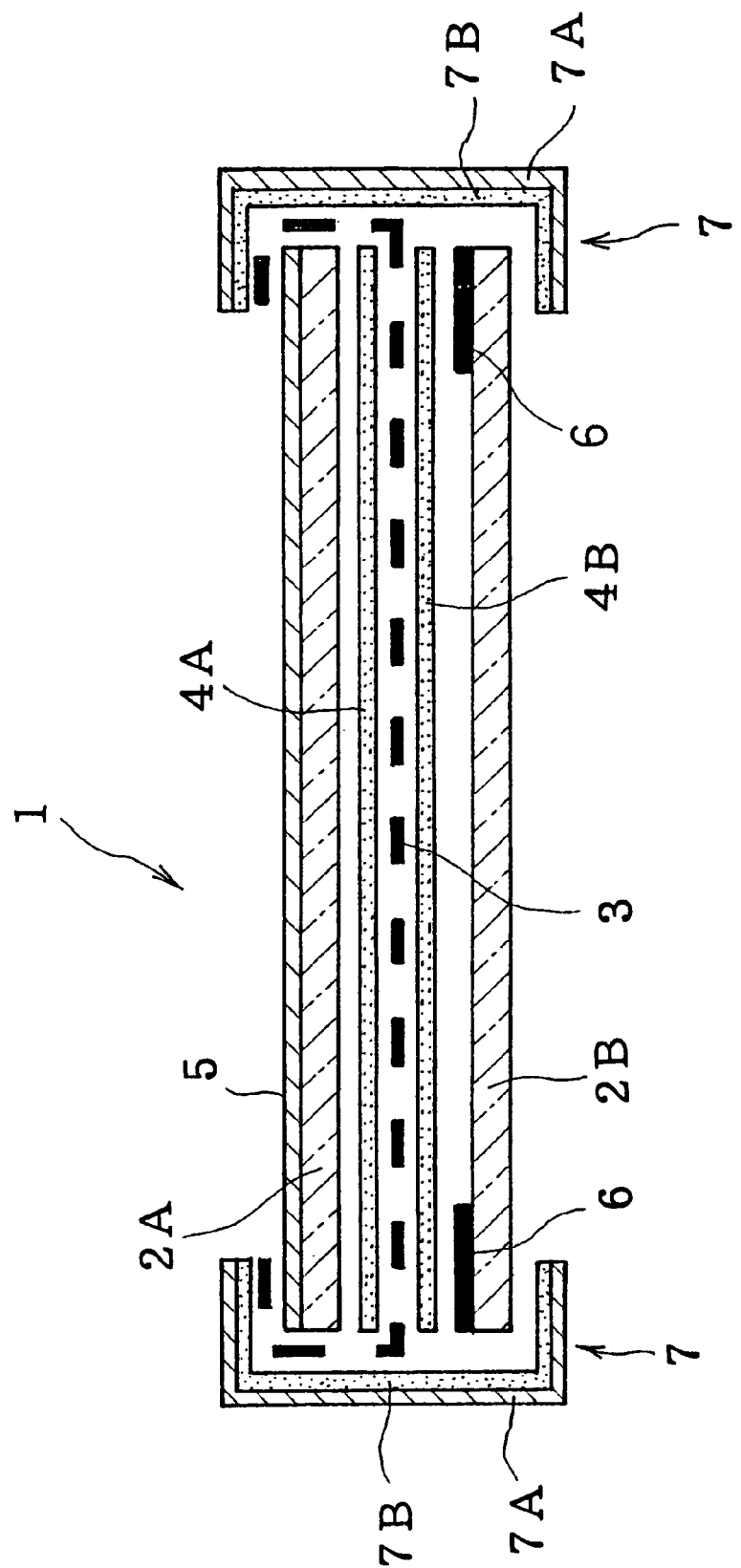
FIG. 1 is a schematic sectional view showing an embodiment of an electromagnetic-wave shielding and light transmitting plate according to the first aspect of the present invention.
Figure 2:
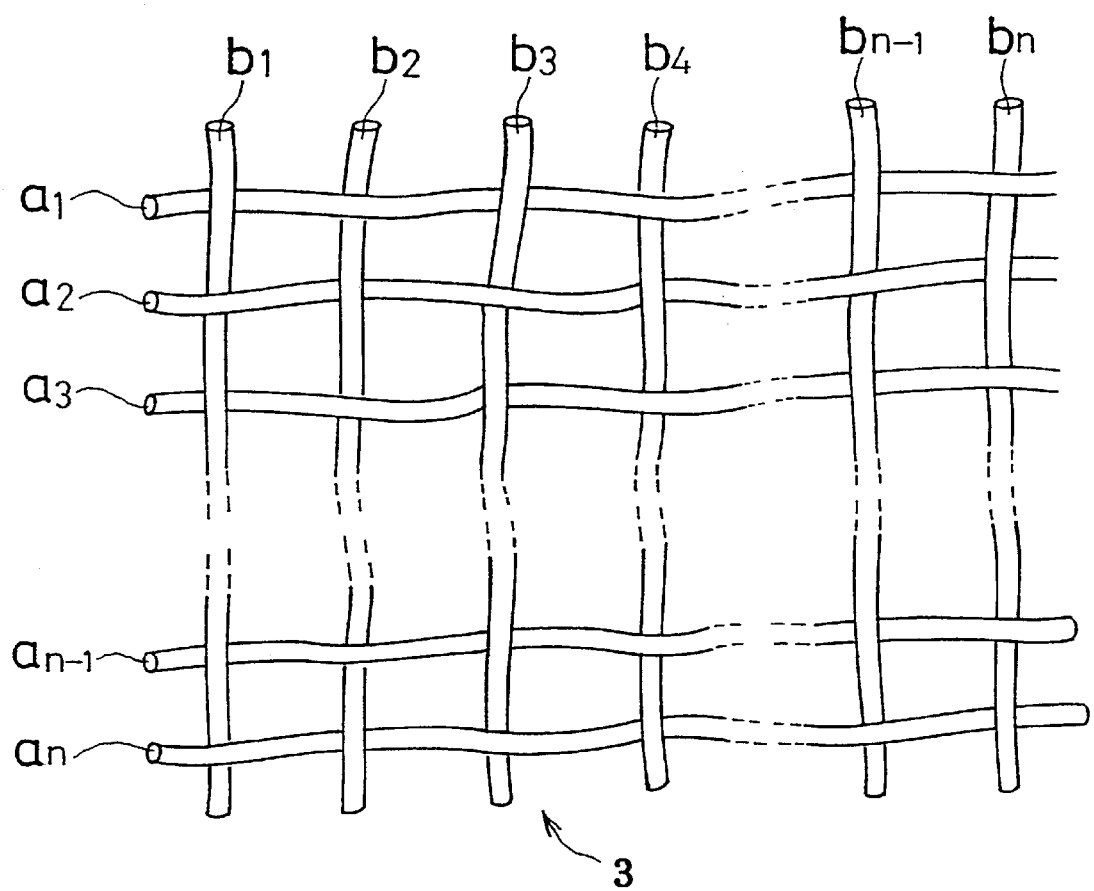
FIG. 2 is an enlarged schematic view showing a conductive composite mesh member according to the present invention.

Reference to FIGS. 1 and 2, the electromagnetic-wave shielding and light transmitting plate of the first aspect of the present invention will be described.

FIG. 1 is a schematic sectional view showing the embodiment of the electromagnetic-wave shielding and light transmitting plate of the first aspect of the present invention. FIG. 2 is an enlarged schematic view showing a conductive composite mesh member according to the present invention.

The electromagnetic-wave shielding and light transmitting plate 1 comprises two transparent base plates 2A, 2B and a conductive composite mash member 3 interposed between adhesive intermediate films 4A, 4B. The conductive composite mesh member 3 with adhesive intermediate films 4A, 4B is interposed between the transparent base plates 2A, 2B and is integrally bonded together to form an assembled unit. The margins of the conductive mesh member 3 positioned outside of the peripheral edges of the transparent base plates 2A, 2B are folded along the peripheral edges of the transparent base plate 2A and are bonded to the transparent plate 2A with a conductive adhesive tape 7. In this manner, the electromagnetic-wave shielding and light transmitting plate 1 is formed.

In this embodiment, the conductive adhesive tape 7 is bonded to all around ends of the assembled unit of the transparent base plates 2A, 2B and the conductive composite mesh member 3 in such a manner as to cover corners between surfaces and the end faces so that the conductive adhesive tape 7 is bonded to outside edges of both transparent base plates 2A, 2B.

In the electromagnetic-wave shielding and light transmitting plate of the present invention, examples of material of the transparent base plates 2A, 2B include glass, polyester, polyethylene terephthalate (PET), polybutylene terephthalate, polymethyl methacrylate (PMMA), acrylic board, polycarbonate (PC), polystyrene, triacetate film, polyvinyl alcohol, polyvinyl chloride, polyvinylidene chloride, polyethylene, ethylene-vinyl acetate copolymer, polyvinylbutyral, metal ionic cross-linked ethylene-methacrylic copolymer, polyurethane, and cellophane. Preferably selected from the above materials are glass, PET, PC, and PMMA.

The thicknesses of the transparent base plates 2A, 2B are suitably determined in accordance with requirements (e.g. strength, light weight) due to the application of a plate to be obtained and are normally in a range from 0.1 to 10 mm.

The transparent base plates 2A, 2B are not necessarily made of the same material. For example, in a case of a PDP front filter of which only the front surface is required to have scratch resistance and durability, the transparent base plate 2A as the front surface may consist of a glass plate having a thickness of 0.1 to 10 mm and the transparent base plate 2B as the rear surface (at the electromagnetic wave source side) may consist of a PET film or PET board, an acrylic film or acrylic board, or a polycarbonate film or polycarbonate board having a thickness of 1 μm to 1 mm. In the electromagnetic-wave shielding and light transmitting plate of this embodiment, acrylic resin-based black painting 6 is provided in a flame shape on the peripheral portion of the rear surface of the transparent base plate 2B.

In the electromagnetic-wave shielding and light transmitting plate 1 of this embodiment, an antireflection film 5 is formed on the surface of the transparent base plate 2A as the front surface. The antireflection film 5 formed on the surface of the transparent base plate 2A is a film or a laminated film of a high-refractive transparent film and a low-refractive transparent film and examples of the film or the laminated films are as follows:

(a) a film consisting of a lower-refractive transparent film than the transparent face plate;
(b) a laminated film consisting of a high-refractive transparent film and a low-refractive transparent film, i.e. two films in amount;
(c) a laminated film consisting of two high-refractive transparent films and two low-refractive transparent films which are alternately laminated, i.e. four films in amount;
(d) a laminated film consisting of a medium-refractive transparent film, a high-refractive transparent film, and a low-refractive transparent film, i.e. three films in amount; and
(e) a laminated film consisting of three high-refractive transparent films and three low-refractive transparent films which are alternately laminated, i.e. six films in amount.

As the high-refractive transparent film, a film, preferably a transparent conductive film, having a refractive index of 1.8 or more can be made of ZnO, $TiO_2$, $SnO_2$, or ZrO in which ITO (tin indium oxide) or ZnO, Al is doped. On the other hand, as the low-refractive transparent film, a film can be made of low-refractive material having a refractive index of 1.6 or less such as $SiO_2$, $MgF_2$, or $Al_2O_3$. The thicknesses of the films vary according to the film structure, the film kind, and the central wavelength because the refractive index in a visible-light area is reduced by interference of light. In case of four-layer structure, the antireflection film is formed in such a manner that the first layer (high-refractive transparent film) is from 5 to 50 nm, the second layer (low-refractive transparent film) is from 5 to 50 nm, the third layer (high-refractive transparent film) is from 50 to 100 nm, and the fourth layer (low-refractive transparent film) is from 50 to 150 nm in thickness.

The antireflection film may be further formed with an antifouling film to improve the fouling resistance of the surface. The antifouling film is preferably a fluorocarbon or silicone film having a thickness in a range from 1 to 1000 nm.

The transparent base plate 2A as the front surface of the electromagnetic-wave shielding and light transmitting plate of the present invention may be further processed by hard coating with silicone material and/or anti- glare finish by hard coating including light-scattering agent. On the other hand, the transparent base plate 2B as the rear surface may be processed by heat ray reflection coating with a metallic film or a transparent conductive film to improve its function. A transparent conductive film may also be formed on the transparent base plate 2A as the front surface. The transparent conductive film is preferably an ITO (indium-tin oxide) or ZnO film having thickness in a range from 0.01–1 $\mu$m.

The above description about the transparent base plates will be applied to transparent base plates 12A, 12B of the second aspect, a transparent base plate 22 of the third aspect, and a transparent base plate 32 of the fourth aspect, which will be described later.

In the present invention, used as the conductive composite mesh member 3 to be interposed between the transparent base plates 2A, 2B is a conductive composite mesh member 3 in which metallic fibers and/or metal-coated organic fibers, of which wire diameter is 200 $\mu$m or less, and transparent fibers are woven.

When the wire diameter of the metallic fibers or metal-coated organic fibers is more than 200 $\mu$m, the light transparency is reduced and the moiré phenomenon easily occurs. When the wire diameter is excessively small, it is difficult to maintain the mesh configuration and the electromagnetic-wave shielding efficiency is reduced. It is therefore preferable that the wire diameter is between 10 and 200 $\mu$m.

According to the present invention, the metallic fibers and/or metal-coated organic fibers of small wire diameter and the transparent fibers are woven in such a manner that the transparent fibers are interworked between the metallic fibers and/or metal-coated organic fibers in order to maintain the mesh configuration. This enables the opening of lattices formed by the metallic fibers and/or metal-coated organic fibers to be larger, thereby improving the light transparency and preventing the moiré phenomenon.

In the conductive composite mesh member according to the present invention, when the ratio of the metallic fibers and/or metal-coated organic fibers is excessively high and the ratio of the transparent fibers is low, the efficiency obtained by using the transparent fibers is little. On the other hand, when the ratio of the transparent fibers is excessively high and the ratio of the metallic fibers and/or metal-coated organic fibers is low, the electromagnetic-wave shielding efficiency is reduced. Therefore, the ratio of the metallic fibers and/or the metal-coated organic fibers and the transparent fibers is preferably, Metallic fibers and/or Metal-coated organic fibers: Transparent fibers=1:1–1:10 (ratio by the number of fibers).

Therefore, the conductive composite mesh member is formed by weaving the metallic fibers and/or the metal-coated organic fibers and the transparent fibers at the above ratio in such a manner that these fibers are dispersed uniformly.

Following are examples of fiber patterns of the conductive composite mesh member 3 in FIG. 2.

Among fibers $a_1, a_2, a_3, \ldots, a_m$ and $b_1, b_2, b_3, \ldots, b_n$, the metallic fibers and/or metal-coated organic fibers are positioned at locations where "m" is divisible by (k+1) ["k" is an integer equal to or more than 0] and "n" is divisible by (l+1) ["l" is an integer equal to or more than 0], while the transparent fibers are positioned at other locations (for example, the metallic fibers and/or metal-coated organic fibers are positioned at locations where "m" is 1, 5, 9, 13, . . . and the transparent fibers are positioned at locations where "m" is 2, 3, 4, 6, 7, 8, 10, 11, 12, 14, . . . ).

In the conductive composite mesh member employed in the present invention, the interworking of the transparent fibers enables the open area ratio of lattices formed by the metallic fibers and/or metal-coated organic fibers to be equal to or more than 75% i.e. relatively larger, thereby improving the light transparency and preventing the moiré phenomenon. It should be noted that the open area ratio is found by calculation based on the wire diameter of mesh and the number of fibers existing in a range of 1 inch. When each interval between the metallic fibers and/or metal-coated organic fibers is excessively large, the electromagnetic-wave shielding efficiency is reduced. It is therefore preferable that the opening of lattices formed by the metallic fibers and/or metal-coated organic fibers is equal to or less than 300 meshes when the wire diameter is about 10 $\mu$m, equal to or less than 165 meshes when the wire diameter is about 20 $\mu$m, equal to or less than 100 meshes when the wire diameter is about 30 $\mu$m, equal to or less than 80 meshes when the wire diameter is about 40 $\mu$m, equal to or less than 60 meshes when the wire diameter is about 50 μm, equal to or less than 30 meshes when the wire diameter is about 100 μm, and equal to or less than 15 meshes when the wire diameter is about 200 μm.

It is preferable that the sieve opening of the conductive composite mesh member made of the metallic fibers and/or metal-coated organic fibers and the transparent fibers is from 5 to 1000 meshes.

Examples as metal of the metallic fibers or metal-coated organic fibers constituting the conductive composite mesh member, include copper, stainless steel, aluminum, nickel, chromium titanium, tungsten, tin, lead, iron, silver, carbon, or alloy thereof. Preferably selected from the above are copper, stainless steel, and aluminum.

Examples as organic material of the metal-coated organic fibers include polyester, nylon, vinylidene chloride, aramid, vinylon, and cellulose.

In this embodiment, the conductive composite mesh member 3 utilizing metal-coated organic fibers and transparent fibers with high toughness is preferable, because edges of the conductive composite mesh member 3 have to be folded back.

By the way, when the refraction factor of the transparent fibers of the conductive composite mesh member 3 is different from the refraction factor of an adhesive intermediate film, reflection occurs between the transparent fibers and the adhesive intermediate film, thus resulting irregularity of images. Accordingly, it is preferable to employ transparent fibers, of which the refraction factor is similar to the refraction factor of transparent adhesive on the adhesive intermediate film in a range of refraction factor differential therebetween equal to or less than ±0.15, particularly ±0.05.

Therefore, preferable examples of the transparent fiber include, when the transparent adhesive is EVA (refraction factor: 1.47–1.50) or PVB (refraction factor: 1.47–1.48), fluorine substituted acrylic fibers such as polytrifluoroethyl acrylate (refraction factor: 1.41), polyether fibers such as polyoxyethylene (refraction factor: 1.46), acrylic fibers such as polybutyl acrylate (refraction factor: 1.46), EVA fibers, PVB fibers, cellulosic fibers (refraction factor: 1.54), polypropylene fibers (refraction factor: 1.47), polyvinyl acetal fibers (refraction factor: 1.48–1.50), polyvinyl alcohol fibers (refraction factor: 1.49–1.53), polyurethane fibers (refraction factor: 1.50), poly (1,2-butadiene) fibers (refraction factor: 1.50), polyethylene fibers (refraction factor: 1.51), polyvinyl chloride fibers (refraction factor: 1.52), polyacrylonitrile fibers (refraction factor: 1.52), NBR fibers (refraction factor: 1.52), polyamide (6 nylon or 6,6 nylon) fibers (refraction factor: 1.53), polystyrene fibers (refraction factor: 1.59), and polyester (polyethylene terephthalate) fibers (refraction factor: 1.63). These are selected according to the transparent adhesives. In addition, it may be not limited to organic fibers and transparent inorganic fibers such as glass may also be employed.

The wire diameter of the transparent fibers is preferably in a range from 10 to 500 μm from the viewpoint of maintenance of mesh configuration.

The above description about the conductive composite mesh member will be applied to a conductive composite mesh member 15 of the second aspect, a conductive composite mesh member 23 of the third aspect, and a conductive composite mesh member 35 of the fourth aspect.

In the present invention, examples of adhesive resins of the transparent adhesive for bonding the transparent base plates 2A, 2B via the conductive composite mesh member 3, include copolymers of ethylene group, such as ethylene-vinyl acetate copolymer, ethylene-methyl acrylic copolymer, ethylene-(meth) acrylic copolymer, ethylene-ethyl (meth) acrylic copolymer, ethylene-methyl (meth) acrylic copolymer, metal ionic cross-linked ethylene-(meth) acrylic copolymer, partial saponified ethylene-vinyl acetate copolymer, calboxylated ethylene-vinyl acetate copolymer, ethylene-(meth) acrylic-maleic anhydride copolymer, and ethylene-vinyl acetate-(meth) acrylate copolymer. It should be noted that "(meth) acrylic" means "acrylic or methacrylic". Besides the above resins, polyvinyl butyral (PVB) resin, epoxy resin, acrylic resin, phenol resin, silicon resin, polyester resin, or urethane resin may also be employed. The best one among them is ethylene-vinyl acetate copolymer (EVA) because it can offer the best balance of performance and can be easily handled. In terms of the impact resistance, the perforation resistance, the adhesive property, and the transparency, PVB resin often used for laminated safety glasses for automobile is also preferable.

It is preferable that the PVB resin contains polyvinyl acetal between 70 and 95% by unit weight and polyvinyl acetate between 1 and 15% by unit weight, and has an average degree of polymerization between 200 and 3000, preferably 300 and 2500. The PVB resin is used as resin composition containing plasticizer.

Examples of plasticizer in the PVB resin composition include organic plasticizers, such as monobasic acid ester and polybasic acid ester, and phosphoric acid plasticizers.

Preferable examples of such monobasic acid ester are ester as a result of reaction of organic acid, such as butyric acid, isobutyric acid, caproic acid, 2-ethylbutyric acid, heptoic acid, n-octyl acid, 2-ethylhexyl acid, pelargonic acid (n-nonyl acid), or decyl acid, and triethylene glycol and, more preferably, are triethylene-di-2-ethylbthyrate, triethylene glycol-di-2-ethylhexoate, triethylene glycol-di-caproate, and triethylene glycol-di-n-ocotoate. Ester of one of the above organic acids and tetraethylene glycol or tripropylene glycol may be also employed.

Preferable examples of plasticizers of polybasic acid ester group are ester of organic acid, such as adipic acid, sebacic acid, or azelaic acid, and straight chain like or brunch like alcohol with from 4 to 8 carbon atoms and, more preferably, are dibutyl sebacate, dioctyl acetate, and dibutyl carbitol adipate.

Examples of phosphoric acid plasticizers include tributoxyethyl phosphate, isodecyl phenyl phosphate, and triisopropyl phosphate.

Insufficient plasticizer in the PVB resin composition reduces the film-forming property, while excessive plasticizer spoils the durability during high temperature. Therefore, the amount of plasticizer in the PVB resin composition is between 5 and 50 parts by weight, preferably between 10 and 40 parts by weight, per 100 parts by weight of polyvinyl butyral resin.

The PVB resin composition may further include, in small amounts, stabilizer, antioxidant, and/or ultraviolet absorbing agent.

The assembled unit of the transparent base plates 2A, 2B and the conductive composite mesh member 3 can be easily made by sandwiching the conductive composite mesh member 3 between two adhesive intermediate films 4A, 4B, in which a predetermined amount of crosslinking agent for heat curing or photo-curing are mixed to the resin such as EVA, interposing them between the transparent base plates 2A and 2B, decompressing and deaerating them under the heated condition, and hardening the adhesive layer by heating or irradiation to integrate them.

The thickness of the adhesive layer consisting of the conductive composite mesh member 3 and the adhesive resins can vary according to the application of the electromagnetic-wave shielding and light transmitting plate and is normally between 2 μm and 2 mm. Therefore, each adhesive intermediate film 4A, 4B is formed to have a thickness from 1 μm to 1 mm to make the adhesive layer having such a thickness.

Hereinafter, the description will now be made as regard to the adhesive layer according to the present invention, by means of an example using EVA as the adhesive resin.

EVA in which the contents of vinyl acetate is between 5 and 50% by weight, preferably between 15 and 40% by weight, is employed. Less than 5% by weight of vinyl acetate interferes with the weatherability and the transparency, while exceeding 40% by weight of vinyl acetate significantly reduces mechanical characteristics, makes the film forming difficult, and produce a possibility of blocking between films.

Suitably employed as the crosslinking agent when the EVA is crosslinked by heating is organic peroxide which is selected according to the temperature for sheet process, the temperature for crosslinking agent, and the storage stability. Examples of available peroxide includes 2,5-dimethylhexane-2,5-dihydro peroxide; 2,5-dimethyl-2,5-di (tert-butyl-peroxy)-hexane-3; di-tert-butyl peroxide; tert-butylcumyl peroxide; 2,5-dimethyl-2,5-di (tert-butyl-peroxy)-hexane; dicumyl peroxide; α, α'-bis (tert-butyl peroxy)-benzene; n-buthyl-4,4-bis (tert-butyl-peroxy)-valerate; 2,2-bis (tert-butyl-peroxy)-butane, 1,1-bis (tert-butyl-peroxy)-cyclohexane; 1,1-bis (tert-butyl-peroxy)-3,3,5-trimethylcyclohexane; tert-butyl peroxy benzoate; benzoyl peroxide; tert-butyl peroxy acetate; 2,5-dimethyl-2,5-bis (tert-butyl-peroxy)-hexyne-3; 1,1-bis (tert-butyl-peroxy)-3,3,5-trimethylcyclohexane; 1,1-bis (tert-butyl-peroxy)-cyclohexane; methyl ethyl ketone peroxide; 2,5-dimethylhexyl-2,5-bis-peroxy-benzoate; tert-butyl-hydroperoxide; p-menthane hydroperoxide; p-chlorbenzoyl peroxide; tert-butyl peroxyisobutyrate; hydroxyheptyl peroxide; and chlorohexanon peroxide. These are used alone or in mixed state, normally less than 10 parts by weight, preferably from 0.1 to 10 parts by weight per100 parts by weight of EVA.

The organic peroxide is normally mixed to the EVA by an extruder or a roll mill or may be added to the EVA film by means of impregnation by dissolving the peroxide into organic solvent, plasticizer, or vinyl monomer.

In order to improve the properties (such as mechanical strength, optical property, adhesive property, weatherability, blushing resistance, and crosslinking speed) of the EVA, a compound containing one selected from acryloxy group or methacryloxy group and one selected from allyl group may be added into the EVA. Such a compound used for this purpose is usually acrylic acid or methacrylic acid derivative, for example, ester or amide thereof. Examples of ester residues include alkyl group such as methyl, ethyl, dodecyl, stearyl, and lauryl and, besides such alkyl group, cycloxyhexyl group, tetrahydrofurfuryl group, aminoethyl group, 2-hydroethyl, 3-hydroxypropyl group, and 3-chloro-2-hydroxypropyl group. Ester with polyfunctional alcohol such as ethylene glycol, triethylene glycol, polyethylene glycol, trimethylolpropane, or pentaerythritol may be also employed. The typical one of such amide is diacetone acrylamide.

More concretely, examples includes compounds containing polyfunctional ester such as acrylic ester or methacrylate such as trimethylolpropane, pentaerythritol and glycerin, or allyl group such as triallyl cyanurate, triallyl isocyanurate, diallyl phthalate, diallyl isophthalate, and diallyl maleate. These are used alone or in the mixed state, normally from 0.1 to 2 parts by weight, preferably from 0.5 to 5 parts by weight per 100 parts by weight of EVA.

When the EVA is crosslinked by light, photosensitizer is used instead of the above peroxide, normally less than 10 parts by weight, preferably from 0.1 to 10 parts by weight per 100 parts by weight of EVA.

In this case, examples of available photosensitizer include benzoin; benzophenone; benzoin methyl ether; benzoin ethyl ether; benzoin isopropyl ether; benzoin isobutyl ether; dibenzyl; 5-nitroaniline; hexachlorocyclopentadiene; p-nitrodiphenyl; p-nitroaniline; 2,4,6-trinitroaniline; 1,2-benzanthraquinone; and 3-methyl-1,3-diazo-1,9-benzanthrone. These can be used either alone or in the mixed state.

In this case, silane coupling agent is further used as adhesive accelerator. Examples of the silane coupling agent include vinyltriethoxysilane, vinyl-tris (β-methoxyethoxy) silane, γ-methacryloxypropyl trimethoxy silane, vinyltriacetoxy silane, γ-glycidoxypropyltrimetoxysilane, γ-glycidoxypropyltrietoxysilane, β-(3,4-epoxycyclohexyl) ethyl trimethoxy silane, γ-chloropropyl methoxy silane, vinyltrichlorosilane, γ-mercaptopropyl trimethoxy silane, γ-aminopropyl triethoxy silane, and N-(β-aminoethyl)-γ-aminopropyl trimethoxy silane.

These are used alone or in the mixed state, normally from 0.001 to 10 parts by weight, preferably from 0.001 to 5 parts by weight per100 parts by weight of EVA .

The adhesive intermediate films may further include, in small amounts, ultraviolet ray absorbing agent, infrared ray absorbing agent, antioxidant, and/or paint processing aid. For adjusting the color of the filter itself, the adhesive intermediate films may further include coloring agent such as dye and pigment, and/or filler such as carbon black, hydrophobic silica, and calcium carbonate.

It is also effective that the intermediate adhesive layers in sheet condition are surfaced by corona discharge process, low temperature plasma process, electron beam irradiation process, or ultraviolet irradiation process as measures of improving the adhesive property.

The intermediate adhesive layers according to the present invention can be manufactured for example, by first mixing the adhesive resin and the additives listed above, kneading them by an extruder or a roll, and after that, forming in a predetermined configuration by means of a film forming method such as calendering, rolling, T-die extrusion, or inflation. During the film formation, embossing is provided for preventing the blocking between sheets and facilitating the deaerating during compressed onto the transparent base plate.

The above description about the adhesive resin will be applied to adhesive resin films 13A, 13B, 13C of the second aspect, adhesive intermediate films 24A, 24B, 24C of the third aspect, and adhesive resin films 33A, 33B, 33C of the fourth aspect.

As shown in FIG. 1, in the electromagnetic-wave shielding and light transmitting plate of this embodiment, the periphery of the conductive composite mesh member 3 positioned outside of the assembled unit of the transparent base plates 2A, 2B and the conductive composite mesh member 3 is folded along the peripheral edges of the transparent base plate 2A and is bonded on the transparent base plate by the conductive adhesive tape 7.

The conductive adhesive tape 7 is formed, for example, by laying a conductive adhesive layer 7B on one surface of a metallic foil 7A. The metallic foil 7A for the conductive adhesive tape 7 may have a thickness of 1 to 100 μm and may be made of metal such as copper, silver, nickel, aluminum, or stainless steel.

The conductive adhesive layer 7B is formed by applying adhesive material, in which conductive particles are dispersed, onto one surface of the metallic foil 7A.

Examples of the adhesive material include epoxy or phenolic resin containing hardener, acrylic adhesive compound, rubber adhesive compound, silicone adhesive compound and the like.

Conductive materials of any type having good electrical continuities may be employed as the conductive particles to be dispersed in the adhesive. Examples include metallic powder of, for example, copper, silver, and nickel, metallic oxide powder of, for example, tin oxide, tin indium oxide, and zinic oxide, and resin or ceramic powder coated with such a metal or metallic oxide as mentioned above. There is no specific limitation on its configuration so that the particles may have any configuration such as palea-like, dendritic, granular, pellet-like, spherical, stellar, or confetto-like (spherical with many projections) configuration.

The content of the conductive particles is preferably 0.1–15% by volume relative to the adhesive and the average particle size is preferably 0.1–100 μm.

The thickness of the adhesive layer 7B is in a range from 5 to 100 μm in a normal case.

The above description about the conductive adhesive tape will be applied to a conductive adhesive tape 27 of the third aspect, which will be described later.

In the electromagnetic-wave shielding and light transmitting plate shown in FIG. 1, the conductive composite mesh member 3 is formed to have an area larger than that of the transparent base plates 2A, 2B so that the periphery thereof is positioned outside of peripheral edges of transparent base plates so as to form margins when it is interposed therebetween. The conductive composite mesh member 3 is preferably formed in such a size that the margins of the conductive composite mesh member 3 are folded to cover parts of the surface of the transparent base plate 2A and the width of the portion covering the parts is in a range from 3 to 20 mm.

After the transparent base plates 2A, 2B and the conductive mesh member 3 are integrated, the margins of the conductive composite mesh member 3 are folded, and the conductive adhesive tape 7 is wound onto the periphery of the assembled unit to fix the margins onto the surface and is bonded according to a hardening method, such as thermo compression bonding, suitable for the employed conductive adhesive tape 7.

The electromagnetic-wave shielding and light transmitting plate 1 onto which the conductive adhesive tape 7 is bonded can be simply and easily built in the body of the equipment only by fitting it in the body of the equipment and can provide uniform conduction along the peripheral direction between the conductive composite mesh member 3 and the body of the equipment through the conductive adhesive tape 7, thereby exhibiting good electromagnetic-wave shielding efficiency.

It should be noted that the electromagnetic-wave shielding and light transmitting plate 1 shown in FIG. 1 is an example of the electromagnetic-wave shielding and light transmitting plates of the first aspect, so the first aspect is not limited to the illustrative example.

For example, while the conductive composite mesh member 3 is formed such that periphery thereof is positioned outside of the peripheral edges of the transparent base plates 2A, 2B and is folded in the above description, the conductive composite mesh member 3 may be formed such that only two opposite sides thereof are positioned outside of the edges of the transparent base plates 2A, 2B and are folded.

The electromagnetic-wave shielding and light transmitting plate of the first aspect as mentioned above can be effectively used as a front filter of PDP and a window of a place where a precision apparatus is installed, such as a hospital or a laboratory.

Hereinafter, the first aspect will be described more concretely by means of examples, comparative examples, and reference examples.

Adhesive intermediate films used in Examples, Comparative Example, Reference Example were made in a manner described below.

[Preparation of Adhesive intermediate films]

Each adhesive intermediate film was made in such a way that 1 part by weight of 1,1-bis (tert-butyl-peroxy)-3,3,5-trimethylcyclohexane (Perhexa 3M available from NOF Corporation), 0.1 part by weight of γ-methacryloxypropyl trimethoxy silane, 2 parts by weight of diallyl phthalate, and 0.5 part by weight of Sumisolve 130 (available from Sumitomo Chemical Company, Limited.) as ultraviolet absorbing agent were added into and mixed with 100 parts by weight of ethylene-vinyl acetate copolymer (Ultrasen 634 available from Tosoh Corporation: 26% content of vinyl acetate, Melt index 4) and the resultant mixture was extruded by a 40 mm extruder so that an adhesive intermediate film having a thickness of 500 μm with the both surfaces being embossed was provided.

EXAMPLES 1 THROUGH 3,

Comparative Example 1,

Reference Example 1

Used as the front transparent base plate 2A was a float glass plate having a thickness of 2 mm and used as the rear transparent base plate 2B was a glass plate having a thickness of 2 mm of which periphery is painted with black. A conductive composite mesh member or conductive mesh member specified in Table 1 was sandwiched by two adhesive intermediate films to first form a pre-assembled unit. The pre-assembled unit was then interposed between the base plates 2A and 2B to form an assembled unit. The assembled unit was entered into a rubber bag. The rubber bag containing the assembled unit therein was then vacuumed to be deaerated and pre-compressed under the temperature at 90° C. for 10 minutes. After that, the object thus pre-compressed was entered into an oven and heated at 150° C. for 15 minutes so that it is crosslinked and hardened to be integrated. Further, the margins of the conductive composite mesh member were folded and fixed by a conductive adhesive tape. Several plates were made in the same manner as described above.

The resultant plates were measured for the respective electromagnetic-wave shielding effect at 300 MHz, its light transmittance, and its visibility in the following manner. The results are tabulated in Table 1.

[Electromagnetic-wave shielding effect]

The attenuance of field of each sample was measured using EMI shield measuring equipment (MA8602B) available from Anritsu Corporation in conformity with KEC measurement (Kansai Electronic Industrial Promotion Center). The size of each sample was 90 mm×110 mm.

[Light transmittance (%)]

The average light transmittance in a range between 380 nm and 780 nm was measured using a visible ultraviolet spectrophotometer (U-4000) available from Hitachi Ltd.

[Visibility]

Each resultant plate was mounted on a display and it was then observed by the human eye whether interference fringe appeared and whether irregularity is present in images on the display.

TABLE 1

| | Conductive Mesh Member or Conductive Composite Mesh Member | | | | | Electro- | | Visibility | |
|---|---|---|---|---|---|---|---|---|---|
| | Metal-coated Organic Fibers | | Transparent Fibers | | | | | | |
| Examples | Wire Diameter (μm) | Sieve Opening *1 (Mesh) | Wire Diameter (μm) | Material | Refraction Factor Difference *2 | Sieve Opening *3 (Mesh) | magnetic-wave Shielding Efficiency (300 MHz) | Light Transmittance (%) | Presence or absence of moire phenomenon | Irregularity in images |
| Example 1 | 100 | 20 | 100 | Cellulose triacetate | 0.02 | 100 | −35 dB | 77 | Absence | Absence |
| Example 2 | 50 | 50 | 50 | Cellulose triacetate | 0.02 | 100 | −40 dB | 73 | Absence | Absence |
| Example 3 | 20 | 25 | 20 | Cellulose triacetate | 0.02 | 100 | −28 dB | 86 | Absence | Absence |
| Comparative Example 1 | 100 | 100 | — | — | — | 100 | −60 dB | 33 | Presence | Absence |
| Reference Example 1 | 100 | 20 | 100 | Polyvinyl naphthalate | 0.29 | 100 | −35 dB | 76 | Absence | Presence |

*1 opening of lattices formed by metal-coated organic fibers
*2 refraction factor differential from adhesive intermediate film
*3 whole sieve opening of mesh From Table 1, it can be found that the electromagnetic-wave shielding light transmitting plate of the first aspect has excellent light transmittance without moiré phenomenon and irregularity in images.

As mentioned above, the electromagnetic-wave shielding light transmitting plate of the first aspect has excellent electromagnetic-wave shielding efficiency and light transmittance and further has a function of reducing the moiré phenomenon produced by the interference of light with the display. Further, since the conductive composite mesh member is strongly bonded between transparent base plates by transparent adhesive, the transparent base plates do not scatter when receiving an impact so that the plate provides excellent safety and therefore is industrially useful, for example, as an electromagnetic-wave shielding filter for a PDP.

Figure 3A:
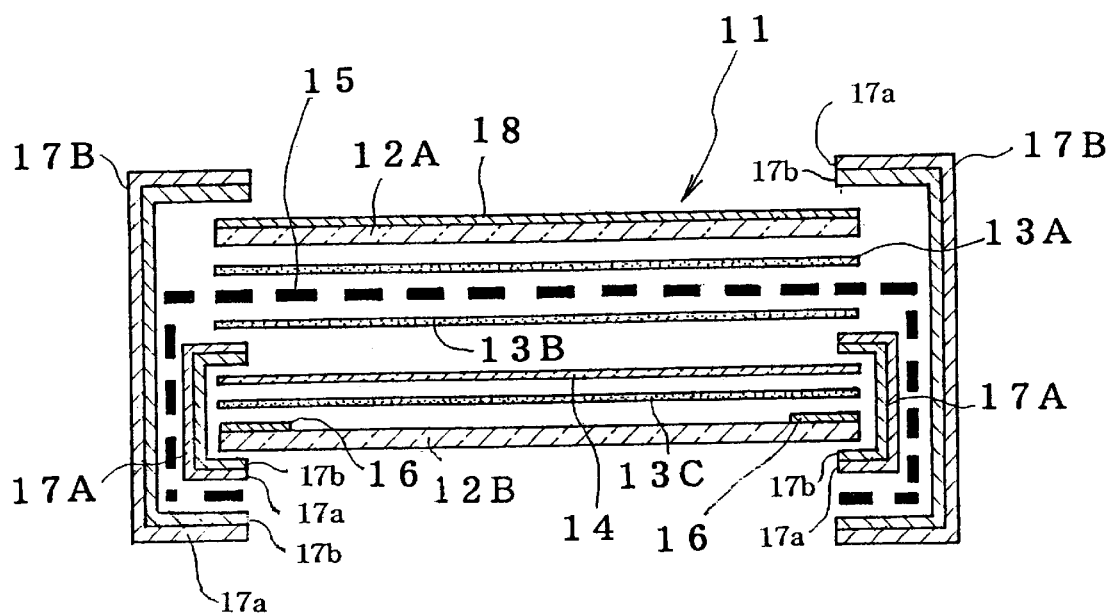
FIG. 3a is a schematic sectional view showing an embodiment of an electromagnetic-wave shielding and light transmitting plate according to the second aspect of the present invention.
Figure 3B:
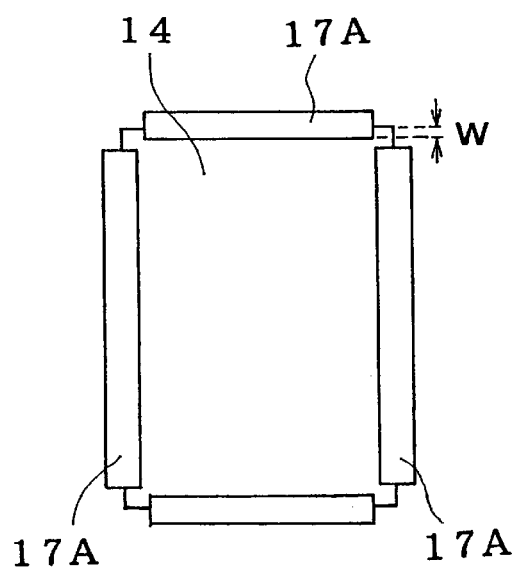
FIG. 3b is a plan view showing a transparent conductive film on which cross-linkable conductive adhesive tape is applied.

With reference to FIGS. 3a, 3b, the electromagnetic-wave shielding and light transmitting plate of the second aspect will now be described later.

FIG. 3a is a schematic sectional view showing an embodiment of the electromagnetic-wave shielding and light transmitting plate according to the second aspect of the present invention, and FIG. 3b is a plan view showing a transparent conductive film on which cross-linkable conductive adhesive tape is applied.

The electromagnetic-wave shielding and light transmitting plate 11 comprises a transparent base plate (first transparent base plate) 12A, a transparent base plate (second transparent base plate) 12B, a transparent conductive film 14 is bonded to one surface of the transparent base plate 12B by a adhesive resin film 13C, and a conductive composite mesh member 15 interposed between the transparent base plates 12A, 12B. These are integrally bonded together by adhesive resin films 13A, 13B to form an assembled unit. First cross-linkable conductive adhesive tapes 17A are bonded from four side edges of the transparent conductive film 14 to peripheral edges of the other surface of the transparent base plate 12B, respectively. In the second aspect, the margins of the conductive composite mesh member 15 positioned outside of the peripheral edges of the transparent base plates 12A, 12B are folded along the peripheral edges of the transparent base plate 12B where the cross-linkable conductive adhesive tapes 17A are attached. Further, a second conductive adhesive tape 17B is further bonded to all around ends of the assembled unit of the transparent base plates 12A, 12B, a conductive composite mesh member 15, and the transparent conductive film 14 in such a manner as to cover corners between surfaces and the end faces so that the conductive adhesive tape 17B is bonded to outside edges of both transparent base plates 12A, 12B.

The cross-linkable conductive tapes 17A, 17B used in the present invention preferably comprises a metallic foil 17a and an adhesive layer 17b, in which conductive particles are dispersed, disposed on one surface of the metallic foil 17a, wherein the adhesive layer 17b is a post-cross-linkable adhesive layer including polymer, of which the principal component is ethylene-vinyl acetate copolymer, and cross-linking agent for the ethylene-vinyl acetate copolymer.

Conductive materials of any type having good electrical continuities may be employed as the conductive particles to be dispersed in the adhesive layer 17b. Examples include metallic powder of, for example, copper, silver, and nickel, metallic oxide powder of, for example, tin oxide, tin indium oxide, and zinic oxide, and resin or ceramic powder coated with such a metal or metallic oxide as mentioned above. There is no specific limitation on its configuration so that the particles may have any configuration such as palea-like, dendritic, granular, or pellet-like configuration.

The content of the conductive particles is preferably 0.1–15% by volume relative to the polymer, described later, forming the adhesive layer 17b and the average particle size is preferably 0.1–100 μm. Such limitation on the content and the particle size prevents condensation of the conductive particles, thereby providing good current conduction.

The polymer forming the adhesive layer 17b preferably contains, as the principal component thereof, ethylene-vinyl acetate copolymer selected from the following (I) through (III) and has melt index (MFR) from 1 to 3000, preferably from 1 to 1000, and more preferably from 1 to 800.

Use of the following copolymers (I) through (III), of which MFR is in a range from 1 to 3000 and of which vinyl acetate content is in a range from 2 to 80% by weight, improves tackiness before cross-linking to improve the working efficiency and rises the three-dimensional cross-linking density after cross-linking, thereby exhibiting quite high bond strength and also improving the moisture and heat resistance:

(I) ethylene-vinyl acetate copolymer of which vinyl acetate content is in a range from 20 to 80% by weight;

(II) copolymer of ethylene, vinyl acetate, acrylate and/or methacrylate monomer, of which vinyl acetate content is in a range from 20 to 80% by weight, and of which acrylate and/or methacrylate monomer content is in a range from 0.01 to 10% by weight; and (III) copolymer ethylene, vinyl acetate, maleic acid and/or maleic anhydride, of which vinyl acetate content is in a range from 20 to 80% by weight, and of which maleic acid and/or maleic anhydride content is in a range from 0.01 to 10% by weight.

In the ethylene-vinyl acetate copolymers of (I) through (III), the content of the vinyl acetate is in a range from 20 to 80% by weight, preferably from 20 to 60% by weight. Less than 20% by weight of vinyl acetate interferes with the exhibition of sufficient cross-linking in case of cross-linkage at high temperature, while more than 80% by weight decreases the softening temperature of resin in case of the ethylene-vinyl acetate copolymers of (I), (II), thereby making the storage difficult that is a problem in practical use, and tends to decrease the bond strength and the durability in case of the ethylene-vinyl acetate copolymer of (III).

In the copolymer of ethylene, vinyl acetate, acrylate and/or methacrylate monomer of (II), the content of the acrylate and/or methacrylate monomer is in a range from 0.01 to 10% by weight, preferably from 0.05 to 5% by weight. Less than 0.01% by weight of the monomer decreases the improvement of the bond strength, while more than 10% by weight tends to affect the workability. Examples of the acrylate and/or methacrylate monomer include monomers chosen from a group of acrylic ester and/or methacrylate ester monomers. Preferably employed as such a monomer is ester of acrylic acid or methacrylic acid and substituted aliphatic alcohol having non-substituting group or substituting group, such as epoxy group, including carbon atoms 1 through 20, particularly, 1 through 18. Examples include methyl acrylate, methyl methacrylate, ethyl acrylate, and glycidyl methacrylate.

In the copolymer ethylene, vinyl acetate, maleic acid and/or maleic anhydride of (III), the content of the maleic acid and/or maleic anhydride is in a range from 0.01 to 10% by weight, preferably from 0.05 to 5% by weight. Less than 0.01% by weight of the content decreases the improvement of the bond strength, while more than 10% by weight tends to affect the workability.

The polymer according to the present invention contains more than 40% by weight, particularly more than 60% by weight, of the ethylene-vinyl acetate copolymer of (I) through (III) and preferably consists of the ethylene-vinyl acetate copolymer of (I) through (III) without other component. When the polymer contains polymer besides the ethylene-vinyl acetate copolymer, the polymer besides the ethylene-vinyl acetate copolymer may be olefin polymer of which backbone contains more than 20 mole % of ethylene and/or propylene, polyvinyl chloride, acetal resin, or the like.

The crosslinking agent for the aforementioned polymer may be organic peroxide as crosslinking agent for heat curing to form a thermosetting adhesive layer or may be photosensitizer as crosslinking agent for photo-curing to form a photo-curing adhesive layer.

Such organic peroxide may be any organic peroxide that can be decomposed at a temperature above 70° C. to generate radical, preferably organic peroxide of which decomposition temperature during half-life period of 10 hours is higher than 50° C., and should be selected according to the temperature for applying adhesive material, the preparation condition, the storage stability, the temperature for curing (bonding), and the heat resistance of the adherend.

Examples of available peroxide includes 2,5-dimethylhexane-2,5-dihydro peroxide; 2,5-dimethyl-2,5-di (tert-butyl-peroxy)-hexane-3; di-tert-butyl peroxide; tert-butylcumyl peroxide; 2,5-dimethyl-2,5-di (tert-butyl-peroxy)-hexane; dicumyl peroxide; α,α'-bis (tert-butyl peroxy)-benzene; n-buthyl-4,4-bis (tert-butyl-peroxy)-valerate; 1,1-bis (tert-butyl-peroxy)-cyclohexane; 1,1-bis (tert-butyl-peroxy)-3,3,5-trimethylcyclohexane; tert-butyl peroxy benzoate; benzoyl peroxide; tert-butyl peroxy acetate; methyl ethyl ketone peroxide; 2,5-dimethylhexyl-2,5-bis-peroxy-benzoate; butyl hydroperoxide; p-menthane hydroperoxide; p-chlorbenzoyl peroxide; hydroxyheptyl peroxide; chlorhexanon peroxide; octanoyl peroxide; decanoyl peroxide; lauroyl peroxide; cumyl peroxy octoate; succinic acid peroxide; acetyl peroxide; tert-butyl-peroxy (2-ethylhexanoate); m-toluoyl peroxide; tert-butyl-peroxyisobutyrate; and 2,4-dichlorobenzoyl peroxide. These are used alone or in mixed state, normally from 0.1 to 10% by weight relative to the aforementioned polymer.

On the other hand, suitably employed as such photosensitizer (photopolymerization initiator) is radical photopolymerization initiator. Available hydrogen-drawn type initiators among radical photopolymerization initiators include benzophenone; methyl o-benzoylbenzoate; 4-benzoyl-4'-methyl diphenyl sulfide; isopropylthioxanthone; diethylthioxanthone; and 4-(diethylamino) ethyl benzoate. Among radical photopolymerization initiators, intramolecular cleavage type initiators include benzoin ether, benzoin propyl ether, and benzyldimethl ketal, α-hydroxyalkyphenon type initiators include 2-hydroxy-2-methyl-1-phenylpropane-1-on, 1-hydroxycyclohexyl phenyl ketone, alkyl phenyl glyoxylate, and diethoxy acetophenone, α-aminoalkylphenone type initiators include 2-methyl-1-[4-(methylthio) phenyl]-2-morpholino propane-1, and 2-benzyl-2-dimethylamino-1-(4-morpholino phenyl) butanone-1, and acylphosphine oxide may be employed. These are used alone or in mixed state, normally from 0.1 to 10% by weight relative to the aforementioned polymer.

The adhesive layer according to the present invention preferably includes silane coupling agent as adhesive accelerator. Examples of the silane coupling agent include vinyltriethoxysilane, vinyl-tris (β-methoxyethoxy) silane, γ-methacryloxypropyl trimethoxy silane, vinyltriacetoxy silane, γ-glycidoxypropyltrimetoxysilane, γ-glycidoxypropyltrietoxysilane, β-(3,4-epoxycyclohexyl) ethyl trimethoxy silane, vinyltrichlorosilane, γ-mercaptopropyl trimethoxy silane, γ-aminopropyl triethoxy silane, and N-(β-aminoethyl)-γ-aminopropyl trimethoxy silane. These are used alone or in the mixed state, normally from 0.01 to 5% by weight relative to the aforementioned polymer.

The adhesive accelerator may contain epoxy group containing compound. Examples of epoxy group containing compound include triglycidyl tris(2-hydroxy ethyl) isocyanurate, neopentyl glycol diglycidyl ether, 1,6-hexane diol diglycidyl ether, alyl glycidyl ether, 2-ethyl hexyl glycidyl ether, phenyl glycidyl ether, phenol (EO)$_5$ glycidyl ether, p-tert-butyl phenyl glycidyl ether, diglycidylester adipate, diglycidylester phthalate, glycidyl methacrylate, and butyl glycidyl ether. The same effect can be obtained by alloying polymer containing epoxy group. These epoxy group containing compounds are used alone or in the mixed state, normally from 0.1 to 20% by weight relative to the aforementioned polymer.

In order to improve the properties (such as mechanical strength, adhesive property, optical property, heat resistance, moisture resistance, weatherability, and crosslinking speed) of the adhesive layer, a compound containing one selected from acryloxy group or methacryloxy group and one selected from allyl group may be added into the adhesive layer.

Such a compound used for this purpose is usually acrylic acid or methacrylic acid derivative, for example, ester or amide thereof. Examples of ester residues include alkyl group such as methyl, ethyl, dodecyl, stearyl, and lauryl and, besides such alkyl group, cycloxyhexyl group, tetrahydrofurfuryl group, aminoethyl group, 2-hydroethyl, 3-hydroxypropyl group, and 3-chloro-2-hydroxypropyl group. Ester with polyfunctional alcohol such as ethylene glycol, triethylene glycol, polypropylene glycol, polyethylene glycol, trimethylolpropane, or pentaerythritol may be also employed. The typical one of such amide is diacetone acrylamide. Examples of polyfunctional crosslinking aid include acrylic ester or methacrylate ester such as trimethylolpropane, pentaerythritol, glycerin, and compounds having allyl group such as triallyl cyanurate, triallyl isocyanurate, diallyl phthalate, diallyl isophthalate, and diallyl maleate. These are used alone or in the mixed state, normally from 0.1 to 50% by weight, preferably from 0.5 to 30% by weight relative to the aforementioned polymer. More than 50% by weight of the content sometimes affects the working efficiency during preparation and the applying efficiency of the adhesive material.

In order to improve the workability and the ply adhesion of the adhesive layer, hydrocarbon resin may be added into the adhesive layer. Such hydrocarbon resin to be added for this purpose may be either natural resin or synthetic resin. Examples suitably employed as natural resin are rosin, rosin derivative, and terpene resin. Employed as rosin may be gum rosin, tall oil rosin, or wood rosin. Employed as rosin derivative is rosin which has been hydrogenated, disproportioned, polymerized, esterifyed, or metallic chlorinated. Employed as terpene resin may be terpene resin, such as α-pinene and β-pinene (nopinene), or terpene phenol resin. Besides the above natural resin, dammar, copal, or shellac may be employed. Examples suitably employed as synthetic resin are petroleum resin, phenolic resin, and xylene resin. Employed as petroleum resin may be aliphatic petroleum resin, aromatic petroleum resin, cycloaliphaticb petroleum resin, copolymer petroleum resin, hydrogenated petroleum resin, pure monomer petroleum resin, or coumarone-indene resin. Employed as phenolic resin may be alkylphenolic resin or modified phenolic resin. Employed as xylene resin may be xylene resin or modified xylene resin. The content of the hydrocarbon resin should be suitably selected, preferably from 1 to 200% weight, more preferably from 5 to 150% weight relative to the polymer.

The adhesive layer may further include antioxidant, ultraviolet absorbing agent, dye, and/or processing aid in such an amount not to affect the object of the present invention.

Examples of metal of the metallic foil 17a as the base of the cross-linkable conductive adhesive tapes 17A, 17B of the second aspect include copper, silver, nickel, aluminum, or stainless steel. The thickness of the metallic foil a is normally in a range from 1 to 100 µm.

The adhesive layer 17b is made of mixture in which the ethylene-vinyl acetate copolymer, cross-linking agent, other additives if necessary, and conductive particles are mixed uniformly in a predetermined ratio, and can be easily formed by applying the mixture onto the metallic foil 17a using a roll coater, a die coater a knife coater, a micabar coater, a flow coater, a spray coater or the like. The thickness of the adhesive layer 17b is normally in a range from 5 to 100 µm.

Use of the conductive adhesive tape of cross-linked type, in particular, having a post-cross-linkable adhesive layer containing ethylene-vinyl acetate copolymer and cross-linking agent for the ethylene-vinyl acetate copolymer enables effective assemblage because of the following characteristics:

(i) good adhesion properties, thereby allowing easy temporal adhesion to an adherend with suitable tack;

(ii) suitable tackiness before cross-linking, i.e. enough for the temporal adhesion but not so strong as to allow re-adhesion, thereby facilitate the amendment;

(iii) very strong tackiness after cross-linking, thereby exhibiting high bond strength;

(iv) high moisture and heat resistance, thereby exhibiting high durability; and (v) cross-linkable at a temperature lower than 130° C. in case of thermal cross-linking and cross-linkable even with light. The cross linking can be conducted at a relatively low temperature, thereby facilitating the adhesion operation.

The above description about the cross-linkable conductive adhesive tape will be applied to cross-linkable adhesive tapes 37A, 37B of the fourth aspect, which will be described later.

In the second aspect, used as the transparent base plates 12A, 12B may be plates made of the same material and having the same thickness as the transparent base plates 2A, 2B of the first aspect. The same description may be applied to this aspect with regard to black painting 16 painted on the periphery of the transparent base plate 12B, an antireflection film 18 applied on the transparent base plate 12A at the front side, and, in addition, high functional finish such as soil resistant finish to be applied on the antireflection film 18, hard coating and heat ray reflection to be processed on the transparent base plates 12A, 12B.

The transparent conductive film 14 to be bonded to between the transparent base plates 12B may be a resin film in which conductive particles are dispersed. The conductive particles may be any particles having conductivity and the following are examples of such conductive particles.

(i) carbon particles or powder;

(ii) particles or powder of metal such as nickel, indium, chromium, gold, vanadium, tin, cadmium, silver, platinum, aluminum, copper, titanium, cobalt, or lead, alloy thereof, or conductive oxide thereof, and (iii) particles made of plastic such as polystyrene and polyethylene, which are surfaced with coating layer of a conductive material from the above (i) and (ii).

Because the conductive particles of large particle diameter affect the light transparency and the thickness of the transparent conductive film 14, it is preferable that the particle diameter is 0.5 mm or less. The preferable particle diameter of the conductive particles is between 0.01 and 0.5 mm.

The high mixing ratio of the conductive particles in the transparent conductive film 14 spoils the light transparency, while the low mixing ratio makes the electromagnetic-wave shielding efficiency short. The mixing ratio of the conductive particles is therefore preferably between 0.1 and 50% by weight, particularly between 0.1 and 20% by weight and more particularly between 0.5 and 20% by weight, relative to the resin of the transparent conductive film 14.

The color and the luster of the conductive particles can be suitably selected according to the application. In a case of a display filter, conductive particles having a dark color such as black or brown and dull surfaces are preferable. In this case, the conductive particles can suitably adjust the light transmittance of the filter so as to make the display easy-to-see.

Such a transparent conductive layer on the base film may be made of tin indium oxide, zinc aluminum oxide, or the like by one of methods including vacuum evaporation, sputtering, ion plating, and CVD (chemical vapor deposit). In this case, when the thickness of the transparent conductive layer is less than 0.01 μm, sufficient electromagnetic-wave shielding efficiency can not be obtained, because the thickness of the conductive layer for the electromagnetic-wave shielding is too thin, and when exceeding 5 μm, light transparency may be spoiled.

Examples of matrix resin of the transparent conductive film include polyester, polyethylene terephthalate (PET), polybutylene terephthalate, polymethyl methacrylate (PMMA), acrylic board, polycarbonate (PC), polystyrene, triacetate film, polyvinyl alcohol, polyvinyl chloride, polyvinylidene chloride, polyethylene, ethylene-vinyl acetate copolymer, polyvinylbutyral, metal ionic cross-linked ethylene-methacrylic copolymer, polyurethane, and cellophane. Preferably selected from the above resins are PET, PC, and PMMA.

The thickness of the transparent conductive film 14 is suitably determined in accordance with requirements due to the application of the electromagnetic-wave shielding and light transmitting plate and are normally in a range from 1 μm to 5 mm. The thickness less than 0.01 μm is too thin for the conductive layer for electromagnetic-wave shielding so as not to provide sufficient electromagnetic-wave shielding efficiency, while the thickness exceeding 5 μm may spoil the light transparency.

The above description about the transparent conductive film may be applied to a transparent conductive film 25 of the third aspect and a transparent conductive film 34 of the fourth aspect, which will be described later.

In the second aspect, as the conductive composite mesh member 15 to be interposed between the transparent base plates 12A, 12B, a conductive composite mesh member in which metallic fibers and/or metal-coated organic fibers, of which wire diameter is 200 μm or less, and transparent fibers are woven, may be employed. For example, a conductive composite mesh member having the arrangement of fibers described above with reference to FIG. 2 may be employed.

In the second aspect, as adhesive resin of the adhesive resin films 13A, 13B, 13C bonding the transparent base plates 12A, 12B, the conductive composite mesh member 15, and the transparent conductive film 14, the same adhesive resin of the first aspect mentioned above may be employed.

The thickness of the pre-assembled body formed by the conductive composite mesh member 15, the transparent conductive film 14, and the adhesive resin can vary according to the application of the electromagnetic-wave shielding and light transmitting plate and is normally in a range from 2 μm to 2 mm. Accordingly, the adhesive resin films 13A, 13B, 13C are formed to have such a thickness as to make adhesive layers having such a thickness.

To make the electromagnetic-wave shielding and light transmitting plate 11 shown in FIGS. 3a, 3b, the transparent base plate 12A on which antireflection layer 18 is formed, the transparent base plate 12B provided with black border 16 painted on the periphery thereof, the transparent conductive film 14, the conductive composite mesh member 15, the adhesive resin films 13A, 13B, 13C, and the cross-linkable conductive adhesive tapes 17A, 17B are prepared. The cross-linkable conductive adhesive tapes 17A are attached on the periphery of the transparent conductive film 14, compressed under the heated condition, and crosslinked by for example a heat sealer so as to have conduction between the film and the cross-linkable conductive adhesive tapes 17A. Then, the transparent base plate 12B is laid on the transparent conductive film 14 through the adhesive resin film 13C. After that, the adhesive resin films 13A, 13B with the conductive composite mesh member 15 sandwiched therebetween are interposed between the transparent base plate 12A and the transparent base plate 12B, compressed under the hardened condition of the adhesive resin films 13A through 13C, and heated or irradiated to integrate them. The margins of the conductive composite mesh member 15 are folded and the conductive adhesive tape 17B is further bonded to outside edges of both transparent base plates 12A, 12B.

The cross-linkable conductive adhesive tapes 17A, 17B are bonded to an adherend by tackiness of the adhesive layer 17b thereof (this temporal adhesion allow re-adhesion, if necessary) and then heated or radiated with ultraviolet with some pressures, if necessary. In case of ultraviolet radiation, heating may be also performed. The cross-linkable conductive tapes may be partially bonded by partially heating or radiating ultraviolet.

The thermo compression bonding can be easily conducted by a normal heat sealer. As one of compression and heating methods, a method may be employed that the integrated member bonded with the cross-linkable conductive adhesion tape is inserted into a vacuum bag which is then vacuumed and after that is heated. Therefore, the bonding operation is quite easy.

The bonding condition in case of thermal cross-linking depends on the type of crosslinking agent (organic peroxide) to be employed. The cross-linking is conducted normally at a temperature from 70 to 150° C., preferably from 70 to 130° C. and normally for 10 seconds to 120 minutes, preferably 20 seconds to 60 minutes.

In case of optical cross-linking, many light sources emitting in a ultraviolet to visible range may be employed. Examples include an extra-high pressure, high pressure, or low pressure mercury lamp, a chemical lamp, a xenon lamp, a halogen lamp, a Mercury halogen lamp, a carbon arc lamp, an incandescent lamp, and a laser radiation. The period of radiation is not limited because it depends on the type of lamp and the strength of the light source, but normally in a range from dozens of seconds to dozens of minutes. In order to aid the cross-linking, ultraviolet may be radiated after previously heating to 40–120° C.

The pressure for bonding should be suitably selected and is preferably 5–50 kg/cm$^2$, particularly 10–30 kg/cm$^2$.

The width (designated by W in FIG. 3b) of adhering portions of the cross-linkable conductive adhesive tapes 17A at the edges of the transparent conductive film 14 depends on the area of the electromagnetic-wave shielding and light transmitting plate 11 and usually in a range from 3 to 20 mm.

As mentioned above, the electromagnetic-wave shielding and light transmitting plate 11 with the cross-linkable conductive adhesive tapes 17A, 17B can be quite easily built in a body of equipment only by fitting into the body and can provide uniform and good current conduction between the transparent conductive film 14 and the conductive composite mesh member 15 and the body of equipment through the cross-linkable conductive adhesive tapes 17A, 17B on four sides of the plate, thereby exhibiting high electromagnetic-wave shielding efficiency.

The electromagnetic-wave shielding and light transmitting plate shown in FIGS. 3a, 3b is only one of examples of the electromagnetic-wave shielding and light transmitting plate of the second aspect so that the second aspect is not limited thereto. For example, the cross-linkable conductive adhesive tapes 17A is bonded to four side edges of the transparent conductive film 14 in the illustrative embodiment, but may be bonded to only two side edges opposite to each other. And also, for example, while the four side edges the conductive composite mesh member 15 are positioned out of the transparent base plates 12A, 12B and folded back in the illustrative embodiment, only two side edges opposite to each other may be positioned out of the transparent base plate and folded back. It should be understood that the bonding or positioning out on four-side edges is better in view of uniform current conduction.

In addition, the electromagnetic-wave shielding and light transmitting plate of the second aspect is not limited to that bonding the transparent base plate and a transparent conductive film with adhesive resin film as shown in FIGS. 3a, 3b. The electromagnetic-wave shielding and light transmitting plate may be formed by using the transparent base plate on which a transparent conductive film is directly formed. In this case, formed on the transparent plate is a transparent conductive film as follows:

(1) a metallic film formed in a lattice or punching metal-like arrangement on the plate surface of the transparent base plate by pattern etching, comprising steps of coating with photo-resist, exposing a pattern, and developing the pattern.

(2) a printing film formed in a lattice or punching metal-like arrangement on the plate surface of the transparent base plate by printing a pattern with conductive ink.

In the electromagnetic-wave shielding and light transmitting plate of the second aspect, metallic foil which is formed in lattice or punching metal-like arrangement by pattern etching may be used in place of the transparent conductive film of the electromagnetic-wave shielding and light transmitting plate shown in FIGS. 3a, 3b. Also in this case, the metallic foil is easy to tear at the folded portion. Without folding the metallic foil, current conduction can be easily provided.

The electromagnetic-wave shielding and light transmitting plate of the second aspect as mentioned above is quite suitable for a front filter of PDP and a window of a place where a precision apparatus is installed, such as a hospital or a laboratory.

As mentioned above, the electromagnetic-wave shielding and light transmitting plate of the second aspect can be easily assembled and easily built in a body of equipment as an object of installation and can provide uniform and low-resistant conduction relative to the body of equipment, thereby exhibiting high electromagnetic-wave shielding efficiency.

According to the second aspect, the combination of the transparent conductive film and the conductive composite mesh member enables the electromagnetic-wave shielding and light transmitting plate to have excellent electromagnetic-wave shielding efficiency and light transparency and providing distinct pictures because the conductive composite mesh member can be formed in a mesh design having a large sieve opening with fine fibers without losing the light transmitting efficiency and the electromagnetic-wave shielding efficiency, which should be insufficient only by the conductive composite mesh member, can be compensated by the transparent conductive film. In addition, the electromagnetic-wave shielding and light transmitting plate can be provided with excellent heat-ray (near infrared ray) blocking efficiency.

In the electromagnetic-wave shielding and light transmitting plate of the second aspect, the safety is improved because the conductive composite mesh member is interposed between the transparent base plates and bonded to be integrated so as to prevent scattering of fragments when damaged.

Hereinafter, the display panel of the third aspect of the present invention will be described with reference to FIG. 4.

FIG. 4 is a schematic sectional view showing an embodiment of the display panel of the third aspect of the present invention.

Figure 6:
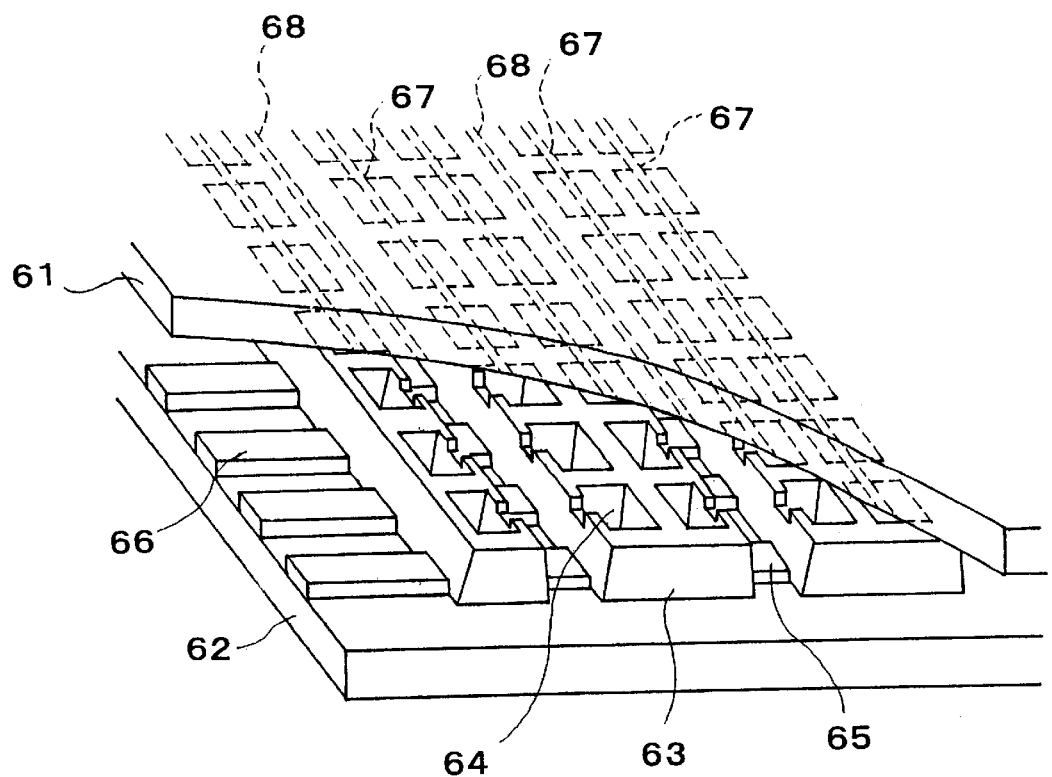
FIG. 6 is a partially perspective cut-way view showing the structure of a normal PDP.

The display panel 21 comprises a transparent base plate 22, a PDP body 20 (any of typical PDPs such as the PDP having the structure as shown in FIG. 6), a conductive composite mesh member 23, and a transparent conductive film 25. The conductive composite mesh member 23 and the transparent conductive film 25 are overlaid and bonded to each other by an adhesive intermediate film 24B to make a pre-assembled unit. The pre-assembled unit is interposed between the transparent base plate 22 and the PDP body 20 through adhesive intermediate films 24A, 24C and integrated together so as to make an assembled unit. Then, the margins, positioned outside of peripheral edges of the transparent base plate 2, of the conductive composite mesh member 23 are folded along the peripheral edges of the transparent base plate 22 and bonded to the transparent base plate 22 by a conductive adhesive tape 27.

In this embodiment, the conductive adhesive tape 27 adheres to all around ends of the assembled unit of the transparent base plate 22, the conductive composite mesh member 23, the transparent conductive film 25, and the PDP body 20 and also adheres to outer edges of both surfaces of the assembled unit, i.e. outer edges of the front surface of the transparent base plate 22 and outer edges of the rear surface of the PDP body 20.

In the third aspect, used as the conductive adhesive tape 27 may be a conductive adhesive layer 27B formed on a surface of a metallic foil 27A in the same manner as that of the first aspect.

In the third aspect, used as the transparent base plate 22 may be plates made of the same material and having the same thickness as the transparent base plate 2A of the first aspect. The same description as the first aspect may be applied to this aspect with regard to an antireflection film 26 applied on the transparent base plate 22, and, in addition, high functional finish such as soil resistant finish to be applied on the antireflection film 26 and other hard coatings to be processed on the transparent base plate 22.

Also in the third aspect, as the conductive composite mesh member 23 to be interposed between the transparent base plate 22 and the PDP body 20, a conductive composite mesh member, just like that of the first aspect, in which metallic fibers and/or metal-coated organic fibers, of which wire diameter is 200 $\mu$m or less, and transparent fibers are woven, may be employed. For example, a conductive composite mesh member having the arrangement of fibers described above with reference to FIG. 2 may be employed.

The transparent conductive film 25 may comprise a resin film or a base film, in which conductive particles are dispersed, and a transparent conductive layer formed on the resin film or the base film as mentioned with regard to the second aspect. In the third aspect, as shown in FIG. 4, the transparent conductive film 25 and the conductive composite mesh member 23 are used together in order to provide excellent electromagnetic-wave shielding efficiency.

In case that conventional adhesives are used for integrating the PDP body and the transparent base plate, when the transparent base plate or the PDP body is broken due to some impact or the like, there is a possibility of the fragments scattering. In order to securely prevent the scattering of fragments when broken due to some impact so as to improve the safety, in the third aspect, transparent elastic adhesives, for example, adhesives normally used for laminated glass is preferably used to integrate the transparent base plate 22, the conductive composite mesh member 23, the transparent conductive film 25, and the PDP body 20. As the transparent elastic adhesives, examples mentioned as the adhesive resin of the first aspect may be employed. Among them, ethylene-vinyl acetate copolymer (EVA) or PVB resin is preferably employed.

The display panel 21 shown in FIG. 4 can be easily made, for example, by using sheet-like adhesive intermediate films 24A, 24B, 24C described in the first aspect, sandwiching the conductive composite mesh member 23 and the transparent conductive film 25 between the adhesive intermediate films 24A, 24B, and 24C, respectively, interposing them between the transparent base plate 22 and the PDP body 20, decompressing and deaerating them under the heated condition, and hardening the adhesive layer by heating or irradiation to integrate them.

The adhesive intermediate films 24A, 24B, 24C are each formed to have a thickness between 1 μm and 1 mm not to make the adhesive layers too thick. The conductive composite mesh member 23 is formed to have an area larger than that of the transparent base plate 22 so that the periphery thereof is positioned outside of peripheral edges of transparent base plate 22 so as to form margins when it is interposed therebetween. The conductive composite mesh member 23 is preferably formed in such a size that the margins of the conductive composite mesh member 23 are folded to cover parts of the surface of the transparent base plate 22 and the width of the portion covering the parts is in a range from 3 to 20 mm.

After the transparent base plate 22, the conductive composite mesh member 23, the transparent conductive film 25, and the PDP body 20 are integrated, the margins of the conductive composite mesh member 23 are folded, and the conductive adhesive tape 27 is wound onto the periphery of the assembled unit to fix the margins onto the surface and is bonded according to a hardening method, such as thermo compression bonding, suitable for the employed conductive adhesive tape 27.

The transparent conductive film 25 is provided with a conductive tape such that margins of the conductive tape are positioned outside of the peripheral edges of the transparent conductive film 25 and the margins of the conductive tape are bonded to the sides of the assembled unit by the conductive adhesive tape 27 to ensure the conduction between the tape and the conductive adhesive tape 27.

The display panel 21 onto which the conductive adhesive tape 27 is bonded can be simply and easily built in the body of the equipment only by fitting it in the body of the equipment and can provide uniform conduction along the peripheral direction between the conductive composite mesh member 23, the transparent conductive film 25, and the body of the equipment through the conductive adhesive tape 27, thereby exhibiting good electromagnetic-wave shielding efficiency.

It should be noted that the display panel shown in FIG. 4 is an example of the display panel of the third aspect, so the third aspect is not limited to the illustrative example. For example, while the conductive composite mesh member 23 is formed such that periphery thereof is positioned outside of the peripheral edges of the transparent base plate 22 and is folded in the above description, the conductive composite mesh member 23 may be formed such that only two opposite sides thereof are positioned outside of the edges of the transparent base plate 22 and are folded.

Though the transparent conductive film 25 is disposed between the conductive composite mesh member 23 and the PDP body 20 as shown in FIG. 4, the transparent conductive film 25 may be disposed between the conductive composite mesh member 23 and the transparent base plate 22. The transparent conductive layer may be directly formed on the bonded surface of the transparent base plate 22 or the front plate of the PDP body 20.

In the display panel of the present invention, a heat-ray blocking film may be interposed between the transparent base plate 22 and the PDP body 20. In this case, the heat-ray blocking film may comprise a base film and a heat-ray blocking coating, such as zinc oxide and silver thin film, processed on the base film. The base film is preferably a film made of PET, PC, PMMA, or the like. The thickness of this film is preferably in a range between 10 μm and 20 mm to prevent the thickness of the resultant display panel from being too thick to ensure its easy handling and its durability. The thickness of the heat-ray blocking coating, which is formed on this base film, is usually from 500 Å to 5000 Å.

In the display panel of the third aspect, by utilizing a PDP which is integrated with electromagnetic-wave shielding material, electromagnetic-wave shielding efficiency is imparted to the display panel itself, thereby lightening its weight, making it thinner, reducing the number of parts, and thus improving the productivity and reducing the cost. In addition, it can prevent the malfunction of a remote controller.

By using, as electromagnetic-wave shielding material, the conductive composite mesh member, in which metallic fibers and/or metal-coated organic fibers having small wire diameter and transparent fibers are woven, it is able to have larger sieve opening maintaining the mesh configuration to obtain excellent light transparency and thus to provide distinct pictures by preventing the moiré phenomenon.

Since, in the display panel of the third aspect, the conductive composite mesh member is interposed between the PDP body and the transparent base plate, the scattering of fragments when damaged can be prevented, thereby improving the safety.

Hereinafter, the display panel of the fourth aspect of the present invention will be described with reference to FIGS. 5a, 5b.

Figure 5A:
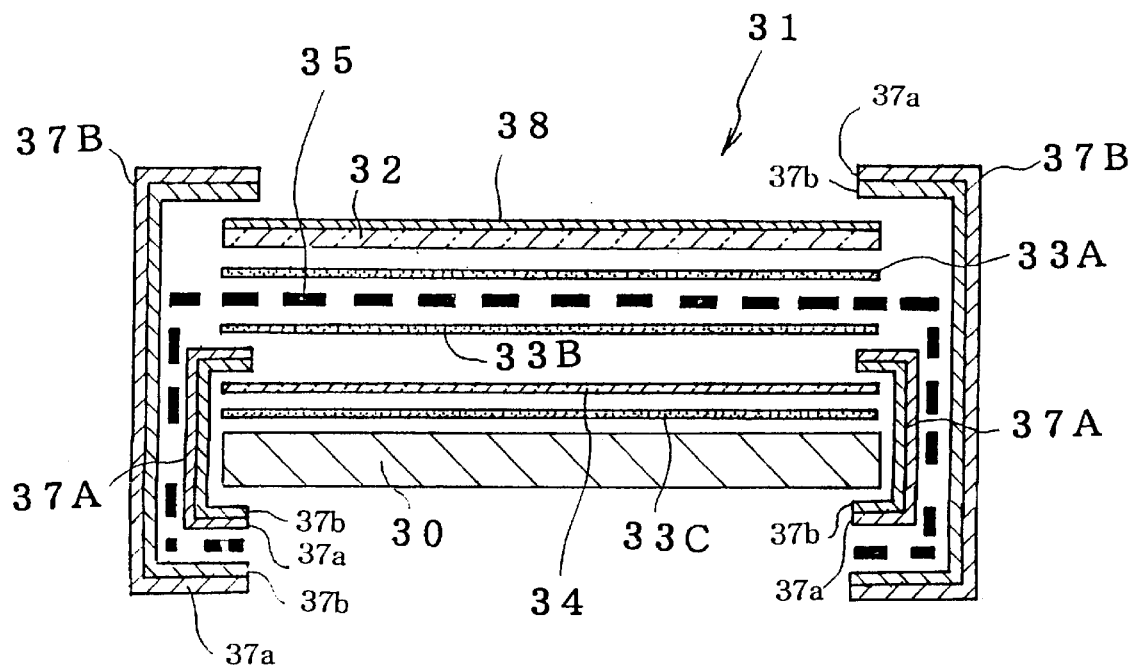
FIG. 5a is a schematic sectional view showing an embodiment of a display panel of the fourth aspect of the present invention.
Figure 5B:
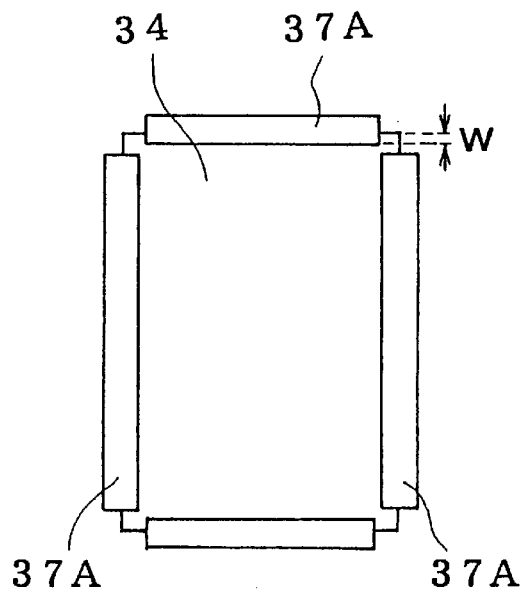
FIG. 5b is a plan view showing a transparent conductive film on which cross-linkable conductive adhesive tape is applied.

FIG. 5a is a schematic sectional view showing an embodiment of the display panel of the present invention, and FIG. 5b is a plan view showing a transparent conductive film on which cross-linkable conductive adhesive tapes are applied.

This display panel 31 comprises a transparent base plate 32, a PDP body 30 (any of typical PDPs such as the PDP having the structure as shown in FIG. 6), and a transparent conductive film 34 bonded on one surface of the PDP body 30 by an adhesive resin film 33C. A conductive composite mesh member 35 is interposed between the transparent base plate 32 and the PDP body 30 and are bonded together using adhesive resin films 33A, 33B so as to form an assembled unit. First cross-linkable conductive adhesive tapes 37A are bonded from four side edges of the transparent conductive film 34 on the PDP body 30 to peripheral edges of the other surface of the PDP body 30, respectively. According to this aspect, the margins of the conductive composite mesh member 35 positioned outside of the peripheral edges of the transparent base plate 32 and the PDP body 30 are folded along the peripheral edges of the PDP body 30 where the cross-linkable conductive adhesive tapes 37A are attached. Further, a second conductive adhesive tape 37B is further bonded to all around ends of the assembled unit of the transparent base plate 32, a conductive composite mesh member 35, the transparent conductive film 34, and the PDP body 30 in such a manner as to cover corners between surfaces and the end faces so that the second conductive adhesive tape 37B is bonded to outside edges of both the transparent base plate 32 and the PDP body 30.

Each of the cross-linkable conductive adhesive tapes 37A, 37B used in the fourth aspect has a metallic foil 37a and an adhesive layer 37b in which conductive particles are dispersed wherein the adhesive layer 37b is disposed on one surface of the metallic foil 37a in the same manner as the second aspect. It is preferable that the adhesive layer 37b is a post-cross-linkable adhesive layer which contains polymer of which main component is ethylene-vinyl acetate copolymer and crosslinking agent.

In the fourth aspect, used as the transparent base plate 32 may be a plate made of the same material and having the same thickness as the transparent base plates 2A of the first aspect as mentioned above. The same description as the first aspect may be applied to this aspect with regard to an antireflection film 38 applied on the transparent base plate 32, and, in addition, high functional finish such as soil resistant finish to be applied on the antireflection film 38, and other hard coatings to be processed on the transparent base plate 32.

The transparent conductive film 34 may comprise a resin film or a base film, in which conductive particles are dispersed, and a transparent conductive layer formed on the resin film or the base film as mentioned with regard to the second aspect. In the fourth aspect, as shown in FIG. 5a, the transparent conductive film 34 and the conductive composite mesh member 35 are used together in order to provide excellent electromagnetic-wave shielding efficiency.

Also in the fourth aspect, as the conductive composite mesh member 35 to be interposed between the transparent base plate 32 and the PDP body 30, a conductive composite mesh member, just like that of the first aspect, in which metallic fibers and/or metal-coated organic fibers, of which wire diameter is 200 $\mu$m or less, and transparent fibers are woven, may be employed. For example, a conductive composite mesh member having the arrangement of fibers described above with reference to FIG.2 may be employed.

Also in the fourth aspect, because of the same reason, transparent elastic adhesives, for example, adhesives normally used for laminated glass is preferably used to integrate the transparent base plate 32, the conductive composite mesh member 35, the transparent conductive film 34, and the PDP body 30. As the transparent elastic adhesives, examples mentioned as the adhesive resin of the first aspect may be employed. Among them, ethylene-vinyl acetate copolymer (EVA) or PVB resin is preferably employed.

The adhesive resin films 33A, 33B, 33C are each formed to have a thickness between 1 $\mu$m and 1 mm not to make the adhesive layers too thick. The conductive composite mesh member 35 is formed to have an area larger than that of the transparent base plate 32 and the PDP body 30 so that the periphery thereof is positioned outside of peripheral edges of transparent base plate 32 and the PDP body 30 so as to form margins when it is interposed therebetween. The conductive composite mesh member 35 is preferably formed in such a size that the margins of the conductive composite mesh member 35 are folded to cover parts of the surface of the PDP body 30 and the width of the portion covering the parts is in a range from 3 to 20 mm.

To make the display panel 31 shown in FIGS. 5a, 5b, the transparent base plate 32A on which antireflection layer 38 is formed, the PDP body 30, the transparent conductive film 34, the conductive composite mesh member 35, the adhesive resin films 33A, 33B, 33C, and the cross-linkable conductive adhesive tapes 37A, 37B are prepared. The cross-linkable conductive adhesive tapes 37A are attached on the periphery of the transparent conductive film 34, compressed under the heated condition, and crosslinked by for example a heat sealer so as to have conduction between the film and the cross-linkable conductive adhesive tapes 37A. Then, the PDP body 30 is laid on the transparent conductive film 34 through the adhesive resin film 33C. After that, the adhesive resin films 33A, 33B with the conductive composite mesh member 35 sandwiched therebetween are interposed between the transparent base plate 32 and the PDP body 30, compressed under the hardened condition of the adhesive resin films 33A through 33C, and heated or irradiated to integrate them. The margins of the conductive composite mesh member 35 are folded and the conductive adhesive tape 37B is further bonded to outside edges of both transparent base plates 32 and PDP body 30.

The cross-inkable conductive adhesive tapes 37A, 37B are bonded to an adherend by tackiness of the adhesive layer 37b thereof (this temporal adhesion allow re-adhesion, if necessary) and then heated or radiated with ultraviolet with some pressures, if necessary. In case of ultraviolet radiation, heating may be also performed. The cross-linkable conductive tapes may be partially bonded by partially heating or radiating ultraviolet.

The heating and bonding method and the bonding condition are the same as those described with regard to the aforementioned second aspect.

The width (designated by W in FIG. 5b) of adhering portions of the cross-linkable conductive adhesive tapes 37A at the edges of the transparent conductive film 34 depends on the area of the display panel 31 and usually in a range from 3 to 20 mm.

As mentioned above, the display panel 31 with the cross-linkable conductive adhesive tapes 37A, 37B can be quite easily built in a body of equipment only by fitting into the body and can provide uniform and good current conduction between the transparent conductive film 34 and the conductive composite mesh member 35 and the body of equipment through the cross-linkable conductive adhesive tapes 37A, 37B on four sides of the plate, thereby exhibiting high electromagnetic-wave shielding efficiency.

The display panel shown in FIGS. 5a, 5b is only one of examples of the display panel of the aspect so that the fourth aspect is not limited thereto. For example, the cross-linkable conductive adhesive tapes 37A is bonded to four side edges of the transparent conductive film 34 in the illustrative embodiment, but may be bonded to only two side edges opposite to each other. And also, for example, while the four side edges the conductive composite mesh member 35 are positioned out of the transparent base plates 32 and POP body 30 and folded back in the illustrative embodiment, only two side edges opposite to each other may be positioned out of the transparent base plate and folded back. It should be understood that the bonding or positioning out on four-side edges is better in view of uniform current conduction.

In addition, the display panel of the fourth aspect is not limited to that bonding the transparent base plate and a transparent conductive film with adhesive resin film as shown in FIGS. 5a, 5b. The display panel may be formed by using the PDP body on which a transparent conductive film is directly formed. In this case, formed on the front panel of the PDP body is a transparent conductive film as follows:

(1) a metallic film formed in a lattice or punching metal-like arrangement on the plate surface of the front panel of the PDP body by pattern etching, comprising steps of coating with photo-resist, exposing a pattern, and developing the pattern.

(2) a printing film formed in a lattice or punching metal-like arrangement on the plate surface of the front panel of the PDP body by printing a pattern with conductive ink.

In the display panel of the fourth aspect, metallic foil which is formed in lattice or punching metal-like arrangement by pattern etching may be used in place of the transparent conductive film of the display panel shown in FIGS. 5a, 5b. Also in this case, the metallic foil is easy to tear at the folded portion. Without folding the metallic foil, current conduction can be easily provided.

In the display panel of the fourth aspect, a heat-ray blocking film may be interposed between the transparent base plate 32 and the PDP body 30. In this case, the heat-ray blocking film may comprise a base film and a heat-ray blocking coating, such as zinc oxide and silver thin film, processed on the base film. The base film is preferably a film made of PET, PC, PMMA, or the like. The thickness of this film is preferably in a range between 10 $\mu$m and 20 mm to prevent the thickness of the resultant display panel from being too thick to ensure its easy handling and its durability. The thickness of the heat-ray blocking coating, which is formed on this base film, is usually from 500 Å to 5000 Å.

As mentioned above, in the display panel of the fourth aspect, by utilizing a PDP which is integrated with electromagnetic-wave shielding material, electromagnetic-wave shielding efficiency is imparted to the display panel itself, thereby lightening its weight, making it thinner, reducing the number of parts, and thus improving the productivity and reducing the cost. In addition, it can prevent the malfunction of a remote controller.

According to the fourth aspect, the combination of the transparent conductive film and the conductive composite mesh member enables the display panel to have excellent electromagnetic-wave shielding efficiency and light transparency and can provide distinct pictures because the conductive composite mesh member can be formed in a mesh design having a large sieve opening with fine fibers without losing the light transmitting efficiency, and the electromagnetic-wave shielding efficiency, which should be insufficient only by the conductive composite mesh member, can be compensated by the transparent conductive film. In addition, the display panel can be provided with excellent heat-ray (near infrared ray) blocking efficiency.

The display panel of the fourth aspect can be easily assembled, can simply and easily built in the body of the equipment, and can securely provide uniform conduction relative to the body of the equipment, thereby exhibiting good electromagnetic-wave shielding efficiency.

In the display panel of the fourth aspect, the safety is improved because the conductive composite mesh member is interposed between the transparent base plate and the PCP body and bonded to be integrated so as to prevent scattering of fragments when damaged.

What is claimed is:

1. An electromagnetic-wave shielding and light transmitting plate comprising two transparent base plates and a conductive mesh member, said conductive mesh member being interposed between said transparent base plates and integrally bonded together by transparent adhesives, wherein said conductive mesh member is a conductive composite mesh member which is made by weaving transparent fibers with at least one of metallic fibers and metal-coated organic fibers, said fibers have a diameter of 200 $\mu$m or less, and said mesh member has an open area ratio of 75% or more.

2. An electromagnetic-wave shielding and light transmitting plate as claimed in claim 1, wherein difference between a refraction factor of said transparent fibers and a refraction factor of said transparent adhesives is less than 0.15.

3. An electromagnetic-wave shielding and light transmitting plate as claimed in claim 1, wherein said transparent adhesives consists of heat-cross-linkable adhesive resin comprising ethylene-vinyl acetate copolymer as a main component and a crosslinking agent.

4. An electromagnetic-wave shielding and light transmitting plate as claimed in any of claims 1, wherein said transparent base plates consists of a first base plate and a second base plate, and wherein a transparent conductive film is provided on a surface of said second base plate, said surface facing to said first base plate.

5. An electromagnetic-wave shielding and light transmitting plate as claimed in claim 4, wherein at least one conductive adhesive tape is bonded to cover a range from the outside edges of said transparent conductive film to the outside edges of the other surface of said second transparent base plate through the end faces of said second transparent base, and margins of said conductive mesh member are positioned outside of the peripheral edges of said first and second transparent base plates, folded along the peripheral edges of said second transparent base plate, and attached to the surface of said second transparent base plate.

6. An electromagnetic-wave shielding and light transmitting plate as claimed in claim 5, wherein a further conductive adhesive tape is bonded to cover a range from the end faces of said first and second transparent base plates to the outside edges of a surface at the non-bonding side of said first transparent base plate and the outside edges of the other surface of said second transparent base plate.

7. An electromagnetic-wave shielding and light transmitting as claimed in claim 5, wherein at least one of said conductive adhesive tapes is a cross-linkable conductive adhesive tape.

8. A display panel comprising a plasma display panel body, a conductive mesh member bonded to a front surface of said plasma display panel body by transparent adhesives, and a transparent base plate bonded to a front surface of said conductive mesh member by transparent adhesives, wherein said conductive mesh member is a conductive composite mesh member which is made by weaving transparent fibers with at least one of metallic fibers and metal-coated organic fibers, said fibers have a diameter of 200 $\mu$m or less, and said mesh member has an open area ratio of 75% or more.

9. A display panel as claimed in claim 8, wherein difference between a refraction factor of said transparent fibers and a refraction factor of said transparent adhesives is less than 0.15.

10. A display panel as claimed in claim 8, wherein said transparent adhesives consists of heat-cross-linkable adhesive resin comprising ethylene-vinyl acetate copolymer as a main component and a crosslinking agent.

11. A display panel comprising a plasma display panel body as claimed in any of claim 8, wherein a transparent conductive film is provided between the plasma display panel body and the conductive composite mesh member;

at least one conductive adhesive tape is bonded to cover a range from the outside edges of said transparent conductive film to the outside edges of the other surface of said plasma display panel body through the end faces of said plasma display panel body; and margins of said conductive composite mesh member are positioned outside of the peripheral edges of said transparent base plate and the plasma display panel body, folded along the peripheral edges of said plasma display panel body, and attached to the surface of said plasma display panel body.

12. A display panel as claimed in claim 11, wherein a further conductive adhesive tape is bonded to cover a range from the end faces of said transparent base plate and said plasma display panel body to the outside edges of a surface at the non-bonding side of said transparent base plate and the outside edges of a surface at the non-bonding side of said plasma display panel body.

13. A display panel as claimed in claim 11, wherein at least one of said conductive adhesive tapes is a crosslinkable conductive adhesive tape.

14. A display panel as claimed in claim 11, wherein said transparent adhesives are transparent elastic adhesives.

* * * * *